United States Patent
Yoon et al.

(12) 
(10) Patent No.: US 7,932,463 B2
(45) Date of Patent: Apr. 26, 2011

(54) QUINACRIDINE DERIVATIVES AND ORGANIC ELECTRONIC DEVICES USING THE SAME

(75) Inventors: Seok-Hee Yoon, Daejeon Metropolitan (KR); Jae-Min Moon, Daejeon Metropolitan (KR)

(73) Assignee: LG Chem, Ltd., Seoul (KR)

( * ) Notice: Subject to any disclaimer, the term of this patent is extended or adjusted under 35 U.S.C. 154(b) by 511 days.

(21) Appl. No.: 12/085,670

(22) PCT Filed: Nov. 24, 2006

(86) PCT No.: PCT/KR2006/004969
§ 371 (c)(1),
(2), (4) Date: May 29, 2008

(87) PCT Pub. No.: WO2007/064104
PCT Pub. Date: Jun. 7, 2007

(65) Prior Publication Data
US 2009/0165848 A1    Jul. 2, 2009

(30) Foreign Application Priority Data

Nov. 30, 2005  (KR) ........................ 10-2005-0115948

(51) Int. Cl.
H01L 31/00  (2006.01)
C07D 221/22 (2006.01)
C07D 498/00 (2006.01)

(52) U.S. Cl. ............ 136/256; 136/263; 546/26; 546/56; 257/40; 257/E51.024

(58) Field of Classification Search .................. 136/256, 136/263; 546/26, 56; 257/40, E51.024
See application file for complete search history.

(56) References Cited

U.S. PATENT DOCUMENTS 5,593,788 A   1/1997  Shi et al.
5,989,737 A   11/1999 Xie et al.

FOREIGN PATENT DOCUMENTS

| JP | 08-048656 | 2/1996 |
| JP | 2003-257670 | 9/2003 |
| JP | 2004-031353 | 1/2004 |

*Primary Examiner* — Jennifer K. Michener
*Assistant Examiner* — Carlos Barcena
(74) *Attorney, Agent, or Firm* — McKenna Long & Aldridge LLP

(57) ABSTRACT

The present invention relates to a novel quinacridine derivative and an organic electronic device using the same.

7 Claims, 3 Drawing Sheets

[Figure 1]
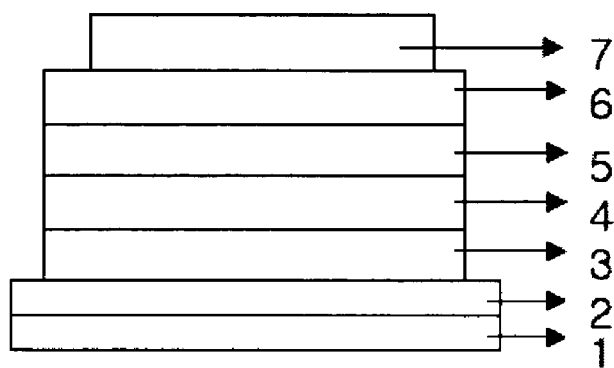
[Figure 2]
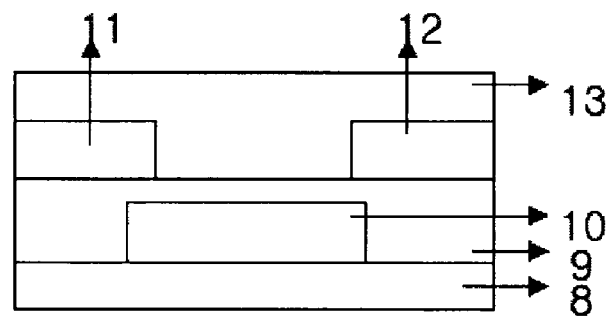
[Figure 3]
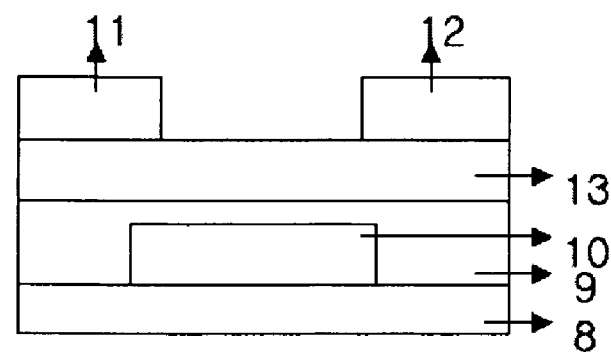

[Figure 4]
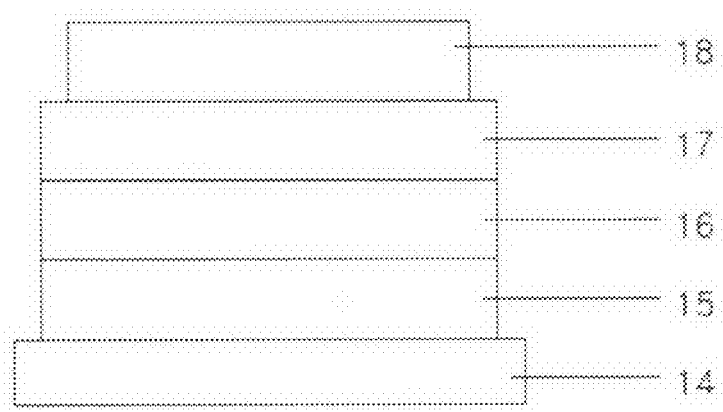
[Figure 5]
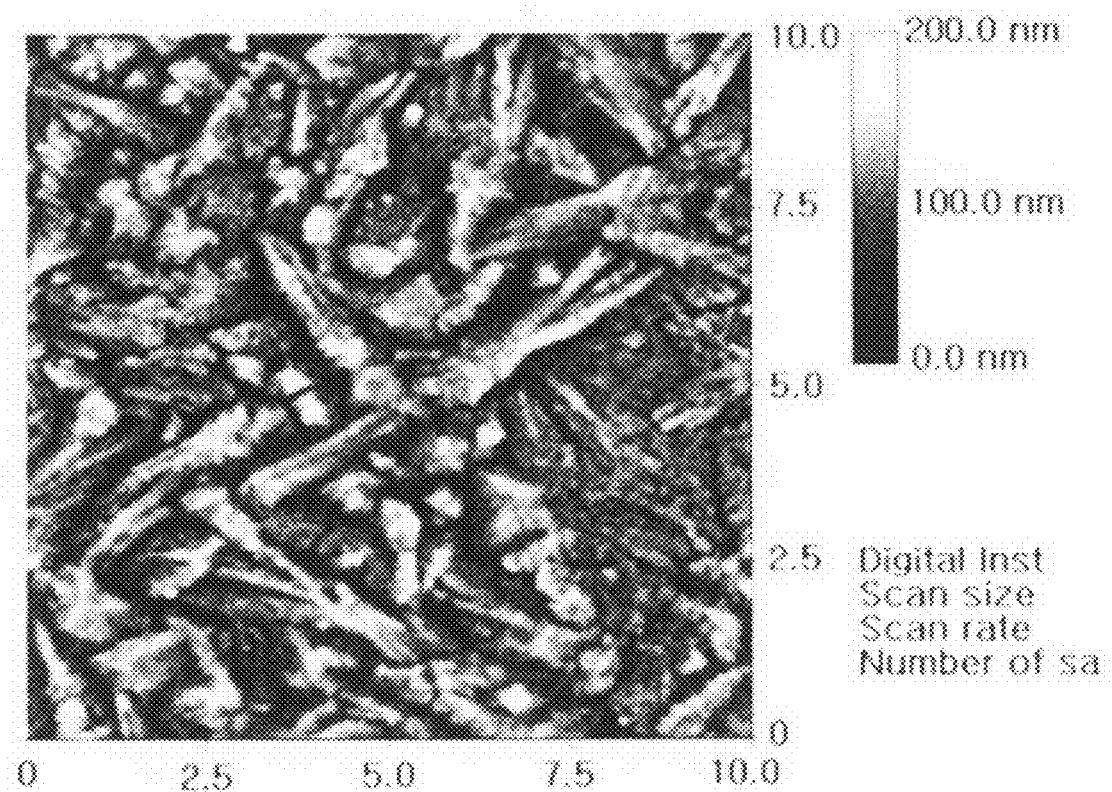

[Figure 6]
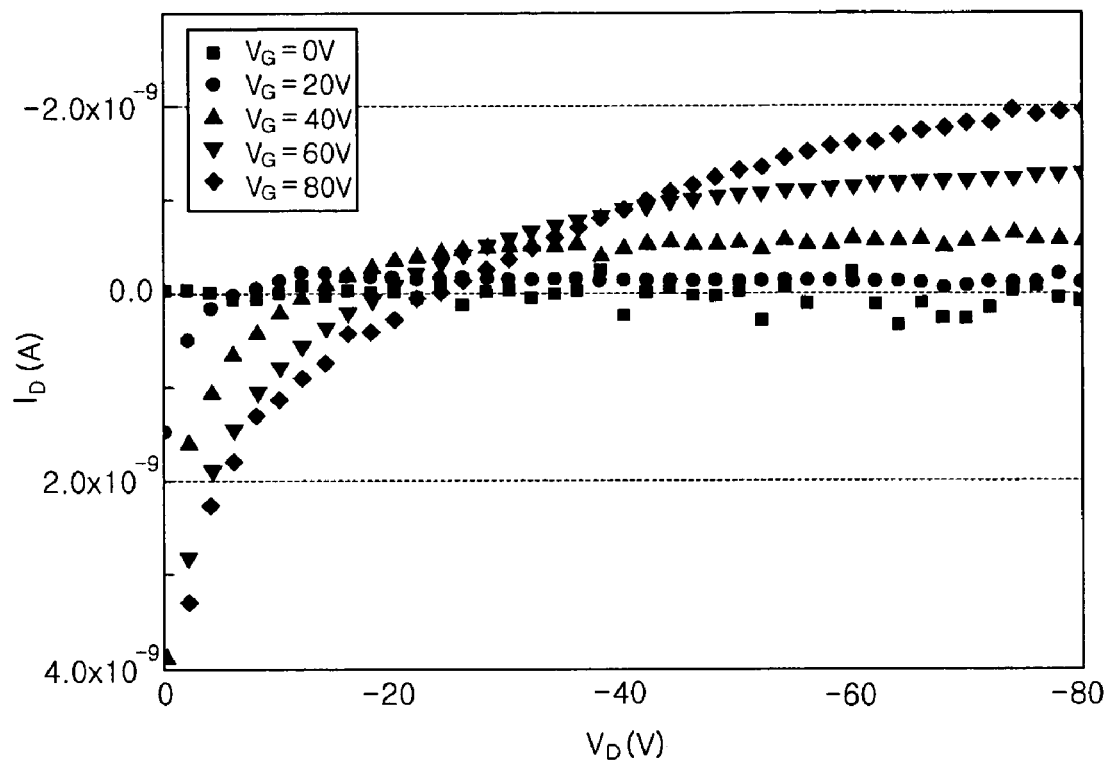

US 7,932,463 B2

QUINACRIDINE DERIVATIVES AND ORGANIC ELECTRONIC DEVICES USING THE SAME

This application claims the benefit of International Application Number PCT/KR/2006/004969 filed on Nov. 24, 2006 and Korean Application No. 10-2005-0115948 filed on Nov. 30, 2005, both of which are hereby incorporated by reference as if fully set forth herein.

TECHNICAL FIELD

The present invention relates to a novel quinacridine derivative and an organic electronic device using the same. Specifically, the present invention relates to a novel quinacridine derivative and an organic electronic device using the same, such as an organic light emitting device, an organic transistor, and an organic solar cell.

This application claims priority benefits from Korean Patent Application No. 10-2005-0115948, filed on Nov. 30, 2005, the entire content of which is fully incorporated herein by reference.

BACKGROUND ART

The current society, also referred to as an information society, has proceeded, accompanied by the discovery of an inorganic semiconductor, which typically includes Si, and by the development of a wide range of the electronic devices using the same. However, the preparation of an electronic device using an inorganic material requires a high temperature or vacuum process, thus needing lots of investments on the equipment for the device, and further has undesirable physical properties for the flexible displays which are a current focus as a next-generation display.

In order to solve the above-described problems, there are suggested organic semiconductor materials, which have recently attracted a great deal of attentions as a semiconductor material having various physical properties. The organic semiconductor materials can be employed in a variety of the electronic devices, which had previously used inorganic semiconductor materials. Typical examples of the electronic devices using the organic semiconductor materials include an organic light emitting device, an organic solar cell, and an organic thin film transistor.

The organic electronic device such as an organic solar cell, an organic light emitting device, or an organic transistor, is an electronic device employing the semiconductor properties of the organic semiconductor material, and usually comprises at least two electrodes and an organic layer between the two electrodes. For example, a solar cell generates electricity using the electrons and the holes, separated from excitions which are generated in an organic layer by means of solar energy. The organic light emitting device introduces the electrons and the holes from two electrodes to an organic layer, to convert the current to visible light. The organic transistor transports the holes or the electrons which are formed on an organic layer by means of the voltage applied on a gate between a source electrode and a drain electrode. In order to improve the electronic devices, the electronic devices can further comprise an electron/hole injecting layer, an electron/hole extracting layer, or an electron/hole transporting layer.

The organic semiconductor materials which are used for the electronic devices should have good hole or electron mobility. To meet this requirement, most of the organic semiconductor materials have conjugated structures.

Further, the organic semiconductor materials used in each of the electronic devices have various preferable morphologies, depending on the characteristics required from the devices.

For example, when a thin film is formed using an organic semiconductor material, the thin film in the organic light emitting device preferably has an amorphous property, whereas the thin film in the organic thin film transistor preferably has a crystalline property.

That is, if an organic thin film in the organic light emitting device has a crystalline property, light emitting efficiency may be reduced, the quenching sites in the charge transport are increased, or the leakage current is increased, thus leading to deterioration of the device performance.

On the other hand, it is favorable that the organic transistor has larger charge transfer property of the organic layer, and accordingly, it is preferable that packing between the molecules of the organic materials are effected, thereby providing the organic thin film with crystallinity. Most preferably, this crystalline organic film has particularly single crystal, and in the case where this crystalline organic film has a polycrystalline form, preferably, the size of each crystalline domain is large, and the domains are well connected with each other.

In order to satisfy these requirements, the substances having non-planar structures such as NPB (4,4'-bis[N-(1-naphthyl)-N-phenylamino]biphenyl), and $Alq_3$ (aluminum tris(8-hydroxyquinoline)) are usually used so as to form amorphous thin films in the organic light emitting devices; and the substances having rod-like structures such as pentacene, and polythiophene, or the substances having planar structures such as phthalocyanine derivative are usually used so as to easily effect packing between the molecules in the organic transistors.

On the other hand, the organic electronic device can be prepared, which comprises at least two organic layers, in which at least two kinds of the organic semiconductor material having different applications are sequentially deposited in order to improve the device performance.

For example, the organic light emitting device can further comprise a hole injecting layer, a hole transporting layer, an electron transporting layer, and an electron injecting layer to facilitate injection and transportation of the holes or electrons from the anode or the cathode, thus enhancing the device performance.

In the case of the organic thin film transistor, there is introduced a method, which involves introducing an auxiliary electrode consisting of an organic semiconductor, or subjecting the electrode to an SAM treatment with an organic material to reduce the contact resistance between the semiconductor layer and the electrode. Further, there is used a method, which involves treating the surface of the insulating layer with an organic material to improve the characteristics concerning the contact with a semiconductor.

In addition, the organic semiconductor material used in the organic electronic device preferably has thermal stability against Joule heat which is generated during the transfer of the charges in the device, and also preferably has a suitable band gap, and an HOMO or LUMO energy level for easy injection or transport of the charges. Further, the organic semiconductor material should be excellent in chemical stability and in the interface characteristics with the electrode or an adjacent layer, as well as in stability against moisture or oxygen.

There is a need of an organic material, which satisfies the characteristics commonly required in the organic electronic device as described above, or the characteristics individually required according to the kind of the electronic device, and if desired, which is more suitable for specific applications in the relevant field.

DISCLOSURE

Technical Problem

The present inventors have discovered a novel structure of a quinacridine derivative. Further, they have found that the novel quinacridine derivative can satisfy the requirements for use in an organic electronic device such as an organic light emitting device, an organic transistor, and an organic solar cell, such as suitable energy levels, and electrochemical and thermal stability, by introducing various substituents to the core structure, and also have amorphous or crystalline property depending on the kind of the substituents, to satisfy the characteristics individually required for each of the devices, thereby playing various roles in the organic electronic device.

Thus, it is an object of the present invention to provide a novel structure of a quinacridine derivative and an organic electronic device using the same.

Technical Solution

The present invention provides a compound of the following formula 1:

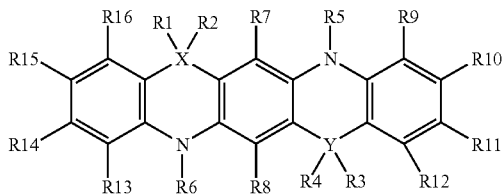

[Formula 1]

wherein X and Y are each respectively or simultaneously C or Si;

R1 to R4 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a halogen group, a substituted or unsubstituted amide group, a substituted or unsubstituted imide group and a substituted or unsubstituted ester group, wherein they may form an aliphatic, aromatic or hetero aromatic fused ring or a spiro bond, together with the adjacent group;

R5 to R16 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a sulfonyl group, a halogen group, a substituted or unsubstituted amide group, a substituted or unsubstituted imide group and a substituted or unsubstituted ester group, wherein R5 and R6 may be directly linked with the adjacent group, respectively and R5 to R16 may form an aliphatic, aromatic or hetero aromatic fused ring, together with the adjacent group.

Further, the present invention provides an organic electronic device comprising at least two electrodes, and at least one organic layer disposed between the two electrodes, wherein at least one layer of the organic layers comprises the compound of the formula 1.

Advantageous Effects

The compound of the present invention is a novel compound, which can satisfy the requirements for use in an organic electronic device such as an organic light emitting device, an organic transistor, and an organic solar cell, such as suitable energy levels, and the electrochemical and thermal stability, by introducing various substituents to the core structure, and also have amorphous or crystalline property depending on the kind of the substituents, to satisfy the characteristics individually required for each of the devices. Thus, the compound of the present invention can play various roles in the above-described organic electronic devices, can lower a drive voltage upon applying it in the organic electronic devices, improve the quantum efficiency, and enhance the lifetime characteristics of the devices by the thermal stability of the compound.

DESCRIPTION OF DRAWINGS

FIG. 1 illustrates an example of the organic light emitting device comprising a substrate (1), anode (2), a hole injecting layer (3), a hole transporting layer (4), a light emitting layer (5), an electron injecting layer (6), and a cathode (7).

FIG. 2 illustrates an example of the organic thin film transistor device of a bottom contact type, comprising a substrate (8), an insulating layer (9), a gate electrode (10), a source electrode (11), a drain electrode (12), and an organic layer (13).

FIG. 3 illustrates an example of the organic thin film transistor device of a top contact type, comprising a substrate (8), an insulating layer (9), a gate electrode (10), a source electrode (11), a drain electrode (12), and an organic layer (13).

FIG. 4 illustrates an example of the organic solar cell comprising a substrate (14), anode (15), an electron donating layer (16), an electron accepting layer (17), and a cathode (18).

FIG. 5 illustrates the results of the surface analysis of the thin film of the compounds of the formula 1-6, prepared in Preparative Example 1.

FIG. 6 illustrates a graph showing the characteristics of the organic transistor wherein the compounds of the formula 1-6, prepared in Preparative Example 1, was used as organic semiconductors.

BEST MODE

Hereinbelow, the present invention will be described in detail.

In the compound of the formula 1, if at least one of R1 to R4 is an alkyl group, an alkenyl group, or an alkynyl group, these preferably have 1 to 20 carbon atoms. Further, if at least one of R1 to R4 is an aryl group or a heterocyclic group, these may include the followings, but it is not intended that the scope of the present invention is limited thereto.

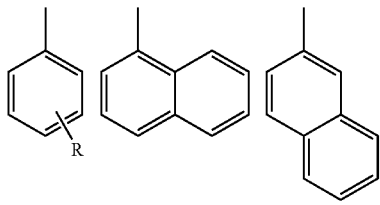
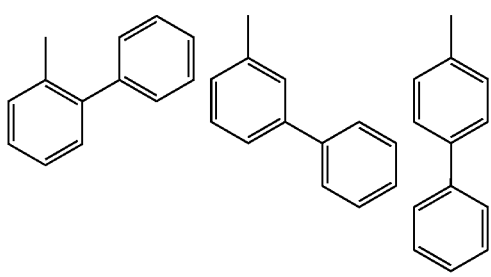
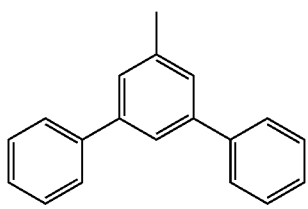
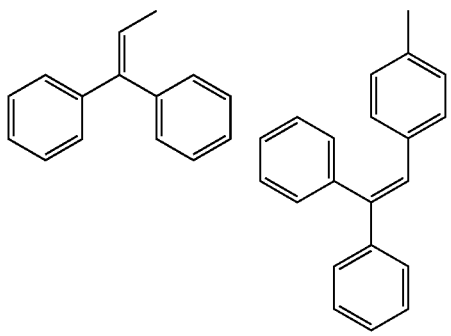
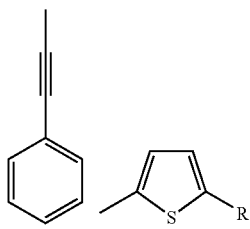
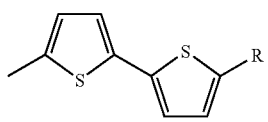
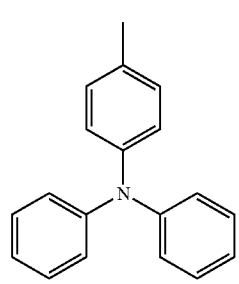

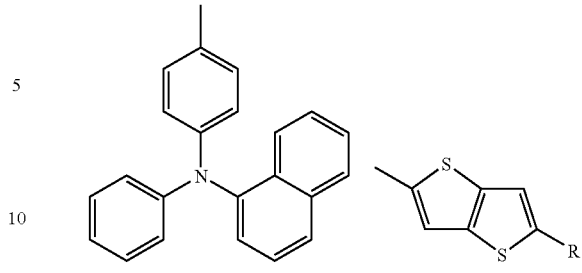

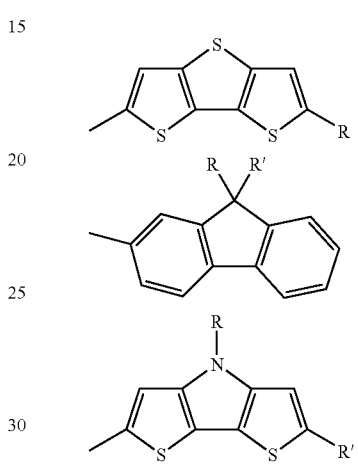

wherein R and R' are each respectively or simultaneously a hydrogen atom, a substituted or unsubstituted straight or branched alkyl group, a substituted or unsubstituted straight or branched alkoxy group, a substituted or unsubstituted straight or branched thioalkoxy group, or a substituted or unsubstituted aryl group.

In the compound of the formula 1, if at least one of R5 to R16 is an alkyl group, an alkenyl group or an alkynyl group, these preferably have 1 to 20 carbon atoms. Further, if at least one of R5 to R16 is an aryl group or a heterocyclic group, these may include the followings, but it is not intended that the scope of the present invention is limited thereto.

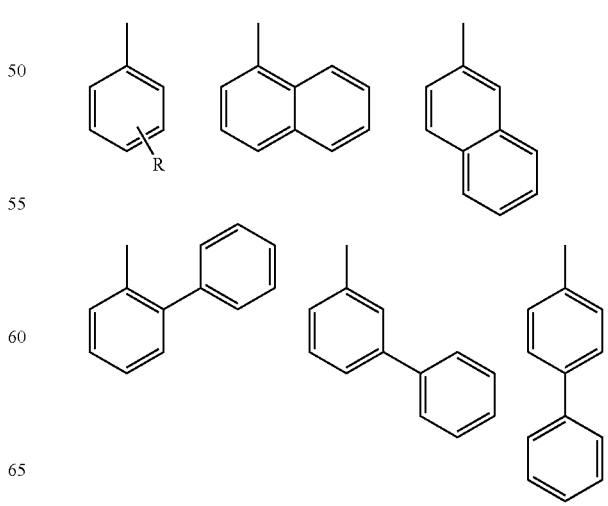

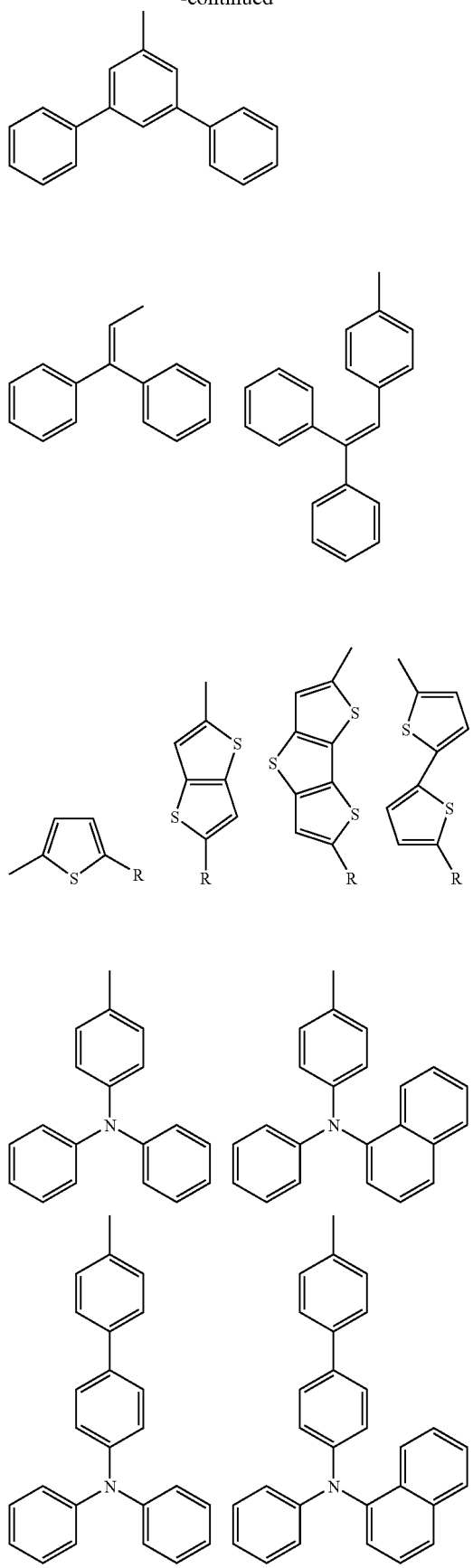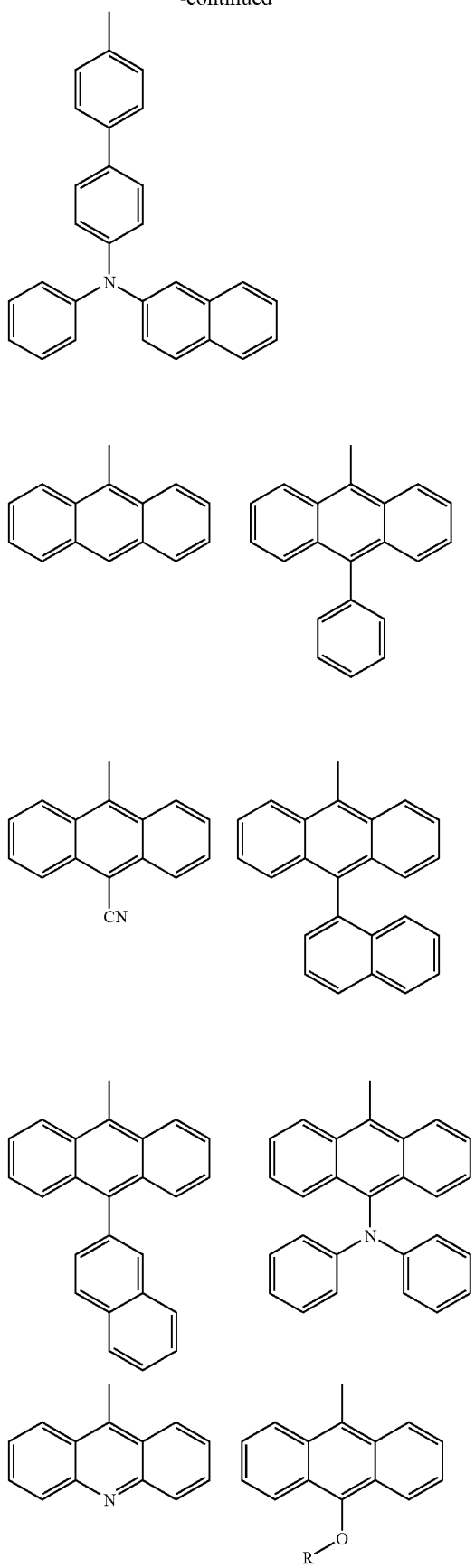

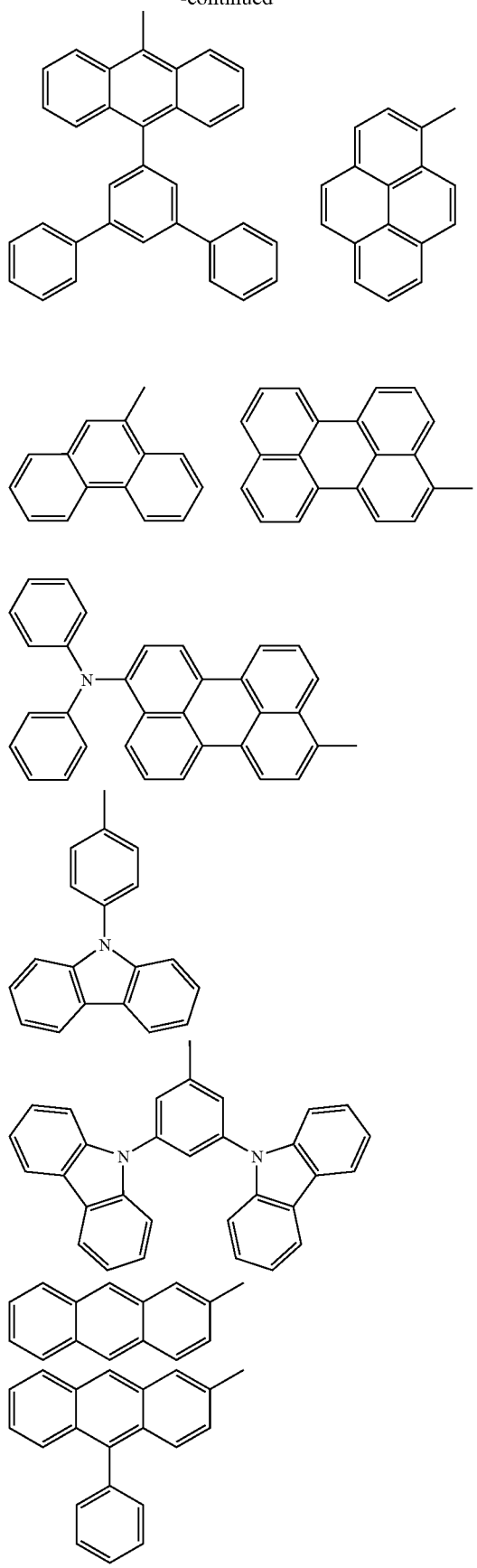
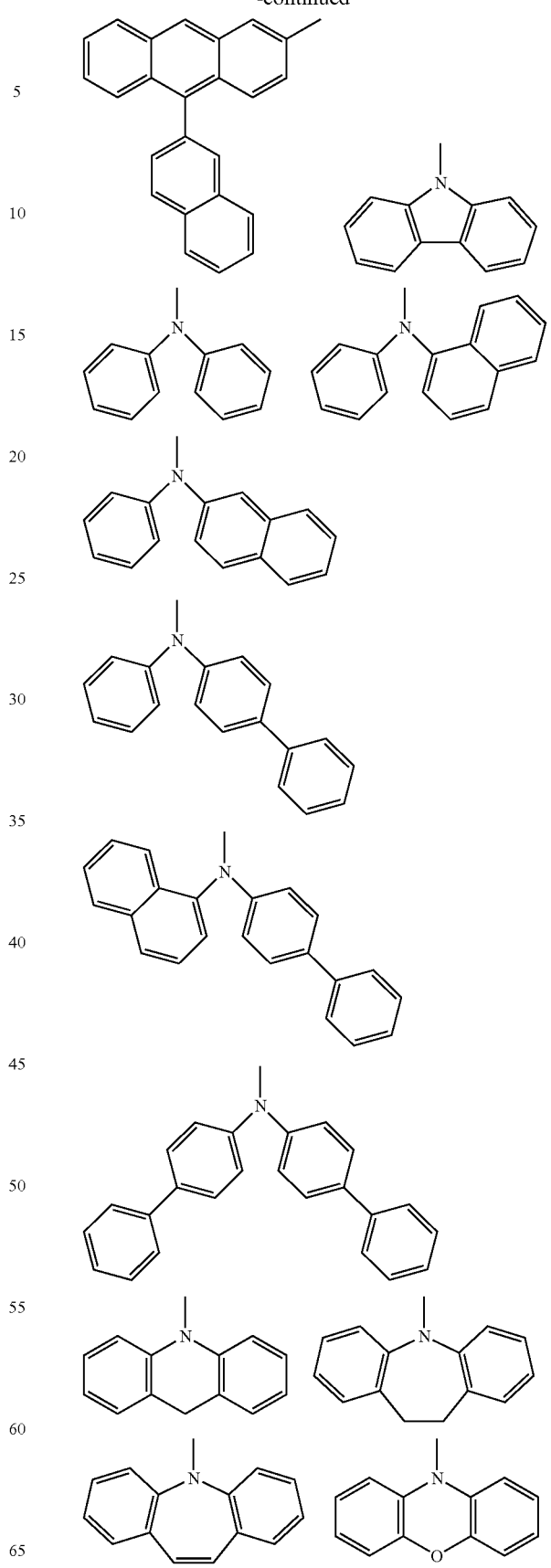

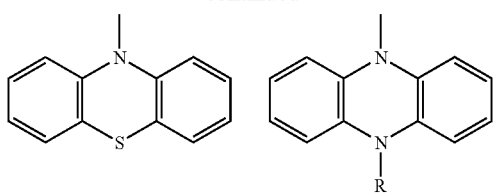

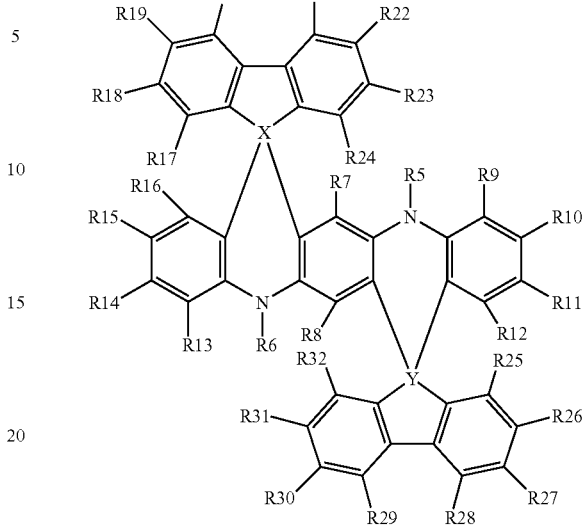

[Formula 2]

wherein X, Y and R5 to R16 are as defined in the formula 1; and

R17 to R32 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a sulfonyl group, a halogen group, a substituted or unsubstituted amide group, a substituted or unsubstituted imide group and a substituted or unsubstituted ester group, wherein they may form an aliphatic, aromatic or hetero aromatic fused ring, together with the adjacent group.

In the formulas 1 and 2, if the substituent is an alkyl group, an alkoxy group, a thioalkoxy group, an alkenyl group, an alkynyl group, an aryl group, an arylamine group, a heterocyclic group, an amino group, an amide group, an imide group or an ester group, it can be an alkyl group, an alkoxy group, thioalkoxy group, alkenyl group, alkynyl group, an aryl group, an arylamine group, a heterocyclic group, an amino group, an amide group, an imide group or an ester group, each of which may be substituted with at least one group from the group consisting of a halogen group, a hydroxy group, an alkyl group, an aryl group, alkenyl group, alkynyl group, an alkoxy group, an amino group, a heterocyclic group, a nitrile group, a sulfonyl group, an ether group, an ester group, an imide group and an amide group.

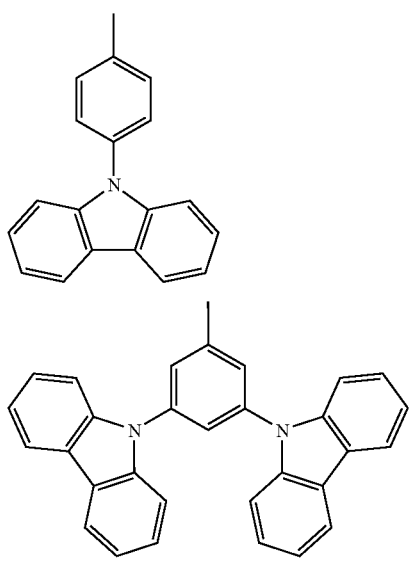

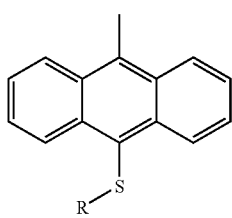

wherein R is a hydrogen atom, a substituted or unsubstituted straight or branched alkyl group, a substituted or unsubstituted straight or branched alkoxy group, a substituted or unsubstituted straight or branched thioalkoxy group, or a substituted or unsubstituted aryl group.

Most preferably, in the formula 1, R1 to R4 are each preferably a $C_1$-$C_{20}$ alkyl group or an aryl group, or form a spiro bond as shown in the following formula 2, and R5 and R6 are preferably a $C_1$-$C_{20}$ alkyl group or an aryl group. The compound of the formula 1 can be a compound of the following formula 2.

Specific examples of the compound of the formula 1 or 2 include the compound represented by the following formulae. However, the following compounds are presented only for the purpose of illustrating the present invention, and not limit the scope of the present invention.

[Formula 1-1]
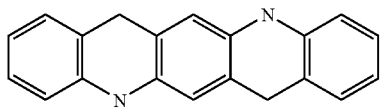
[Formula 1-2]
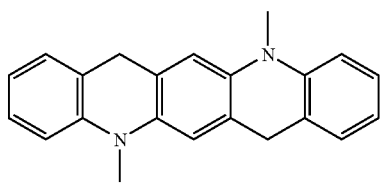
[Formula 1-3]
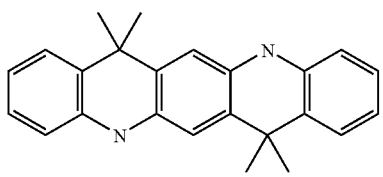
[Formula 1-4]
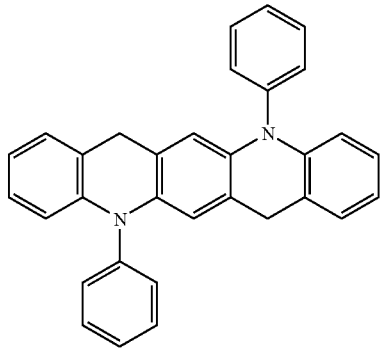
[Formula 1-5]
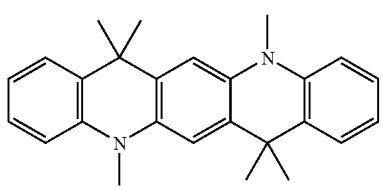
[Formula 1-6]
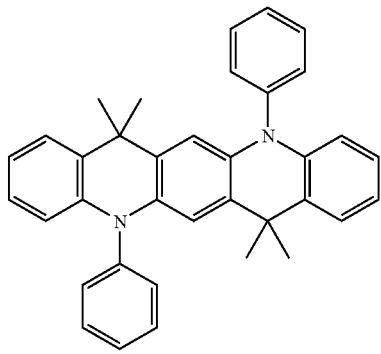
[Formula 1-7]
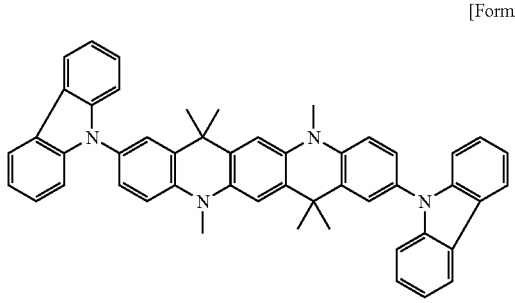
[Formula 1-8]
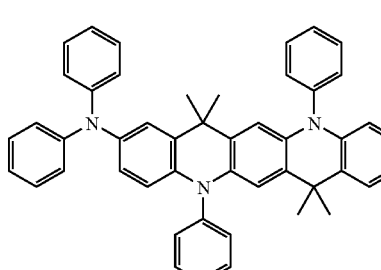
[Formula 1-9]
[Formula 1-10]
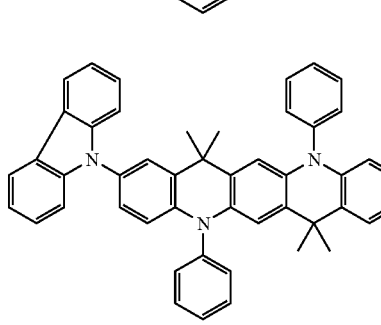

-continued
[Formula 1-11]
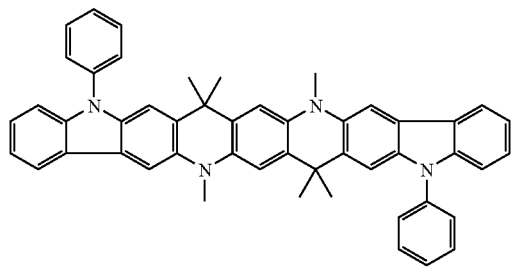
[Formula 1-12]
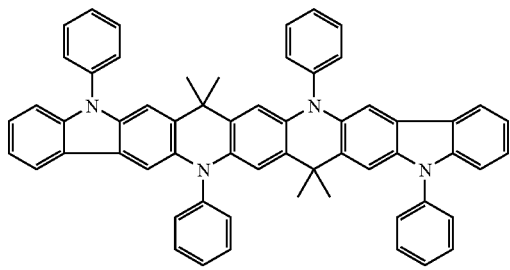
[Formula 1-13]
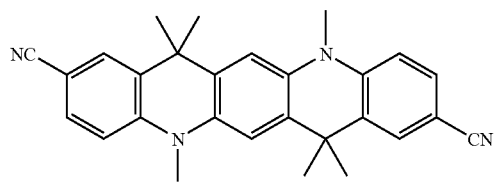
[Formula 1-14]
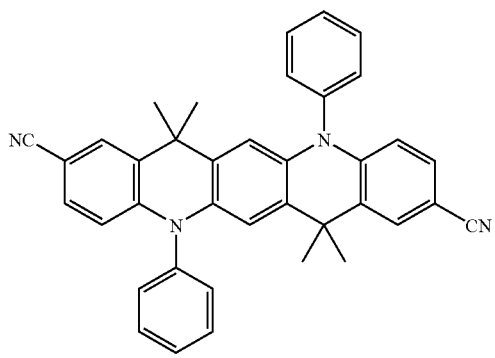
[Formula 1-15]
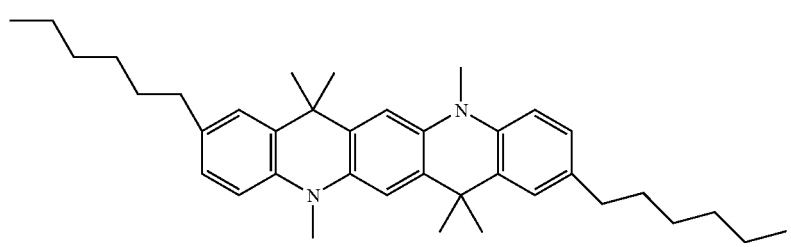
[Formula 1-16]
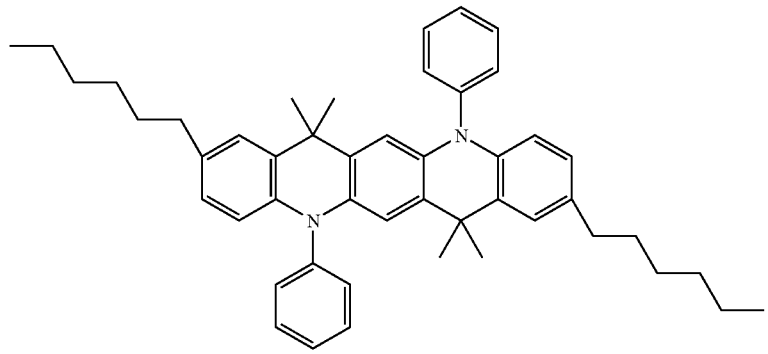
[Formula 1-17]
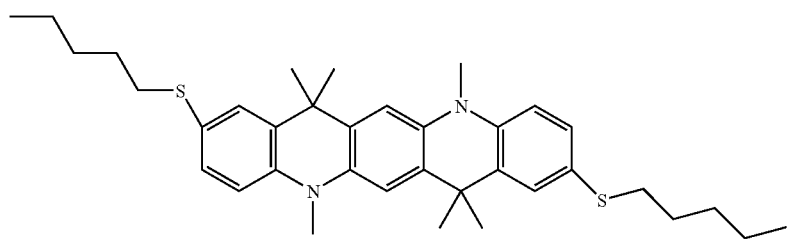

-continued
[Formula 1-18]
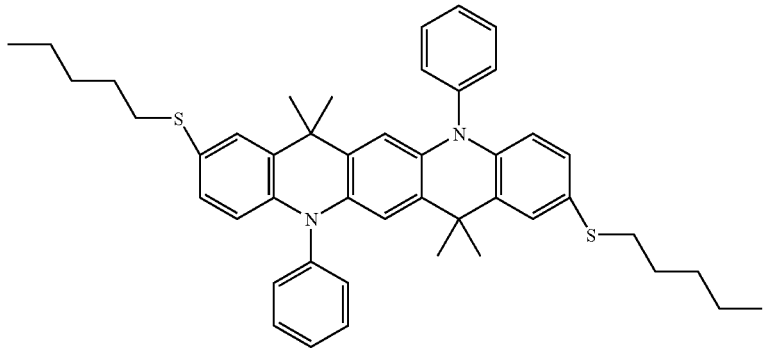
[Formula 1-19]
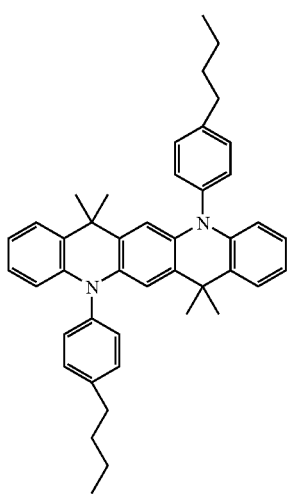
[Formula 1-20]
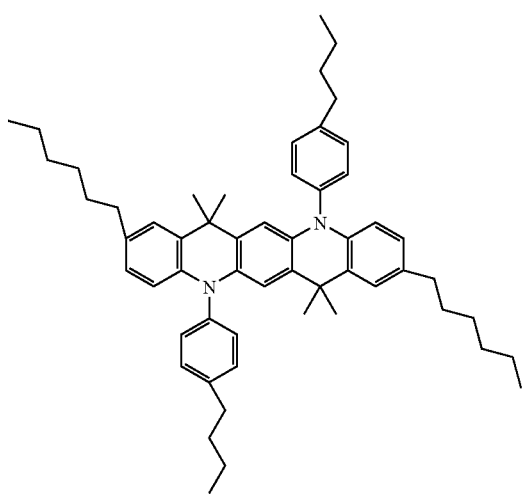
[Formula 1-21]
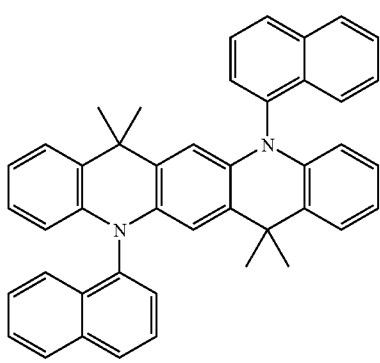
[Formula 1-22]
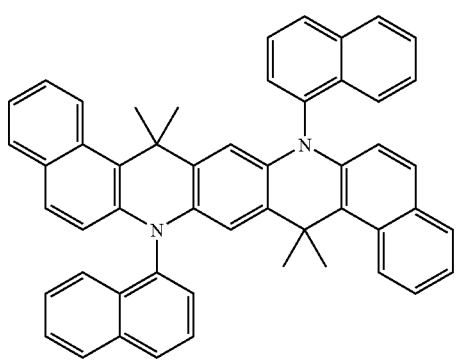
[Formual 1-23]
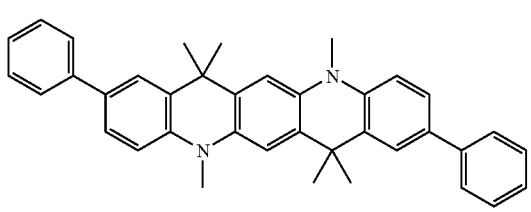
[Formula 1-24]
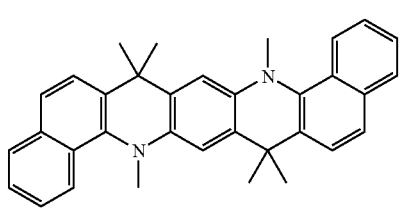

[Formula 1-25]
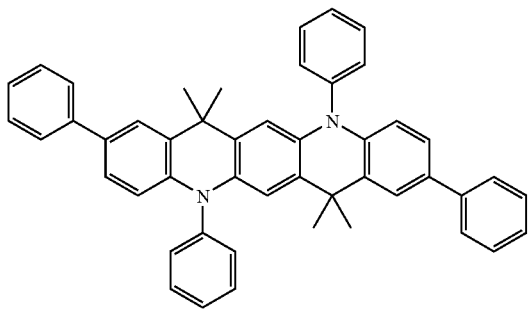
[Formula 1-26]
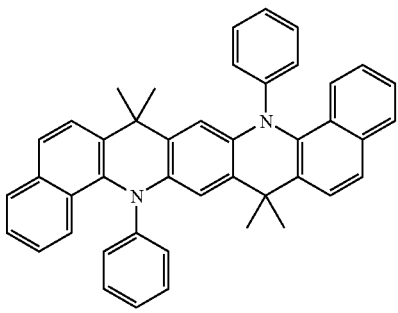
[Formula 1-27]
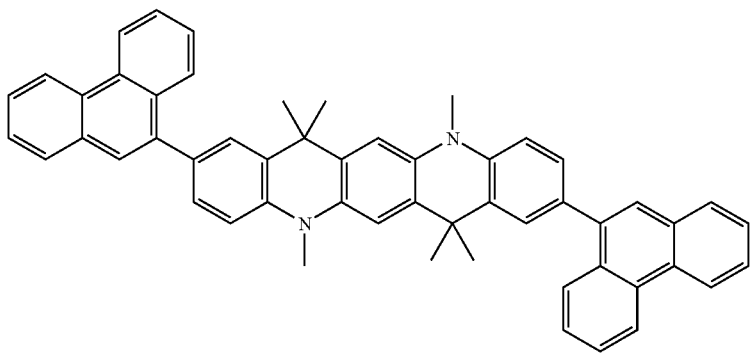
[Formula 1-28]
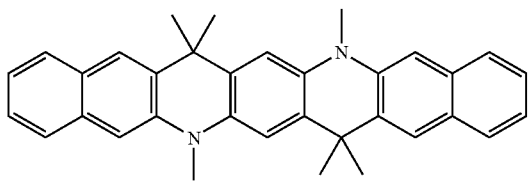
[Formula 1-29]
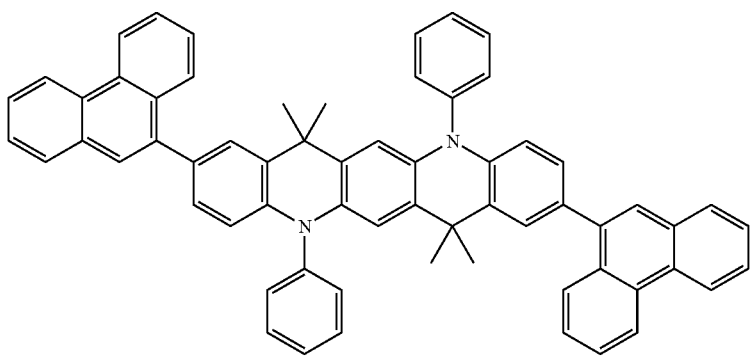
[Formula 1-30]
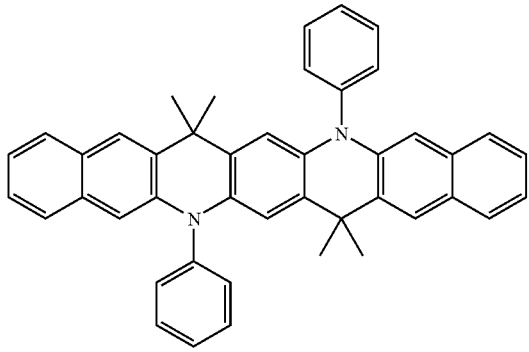

-continued
[Formula 1-31]
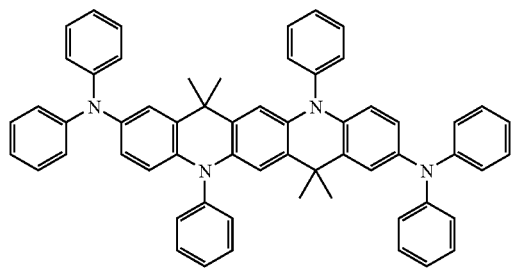
[Formula 1-32]
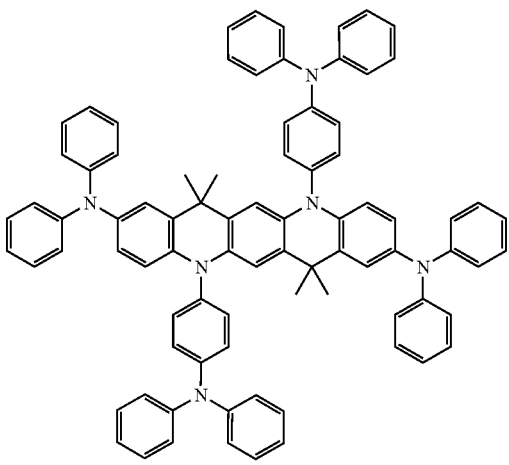
[Formula 1-33]
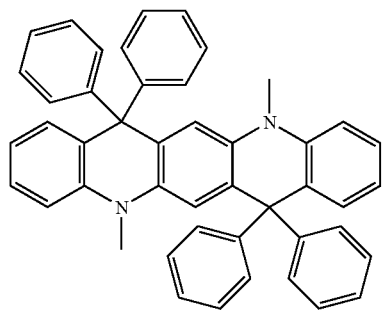
[Formula 1-34]
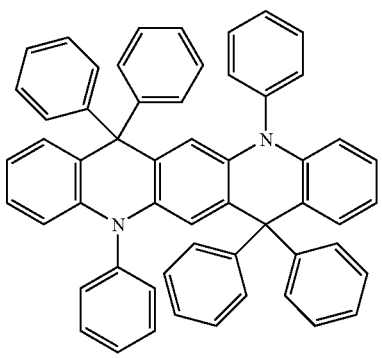
[Formula 1-35]
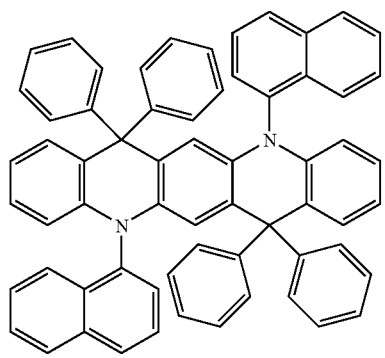
[Formula 1-36]
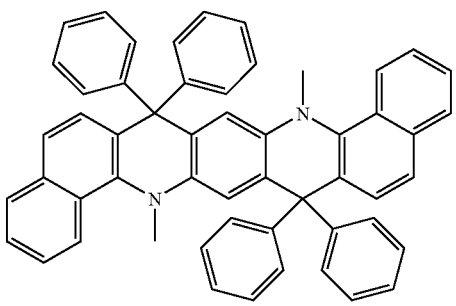

[Formula 1-37]
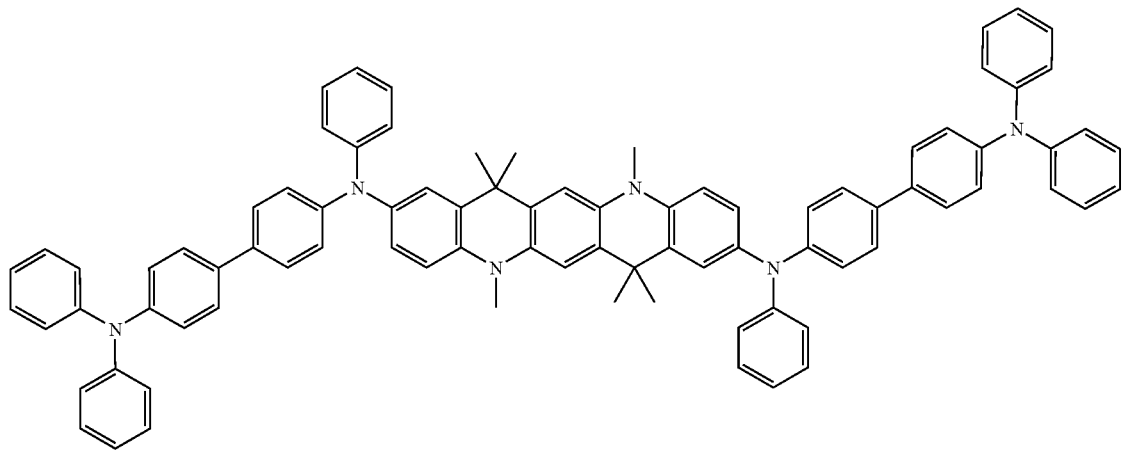
[Formula 1-38]
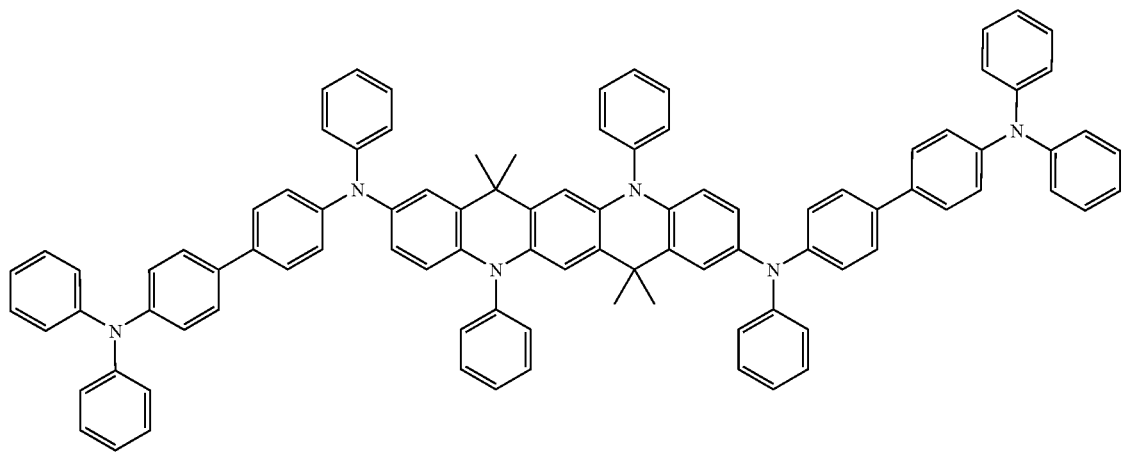
[Formula 1-39]
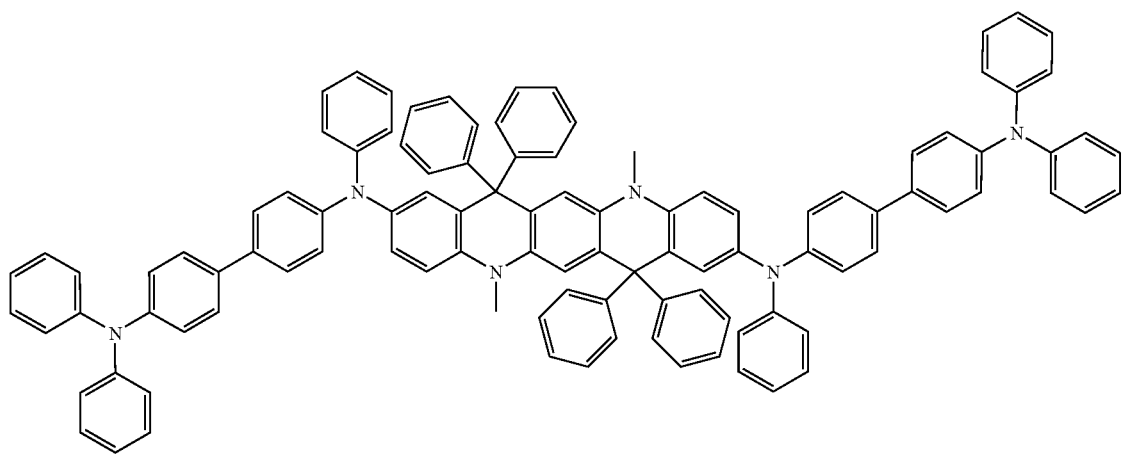

[Formula 1-40]
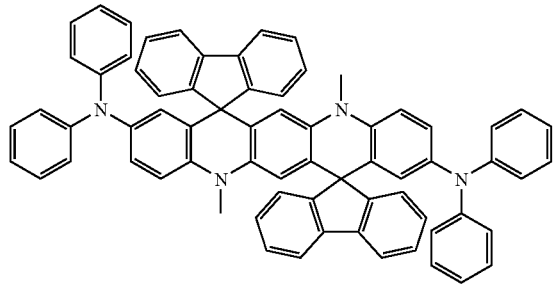
[Formula 1-41]
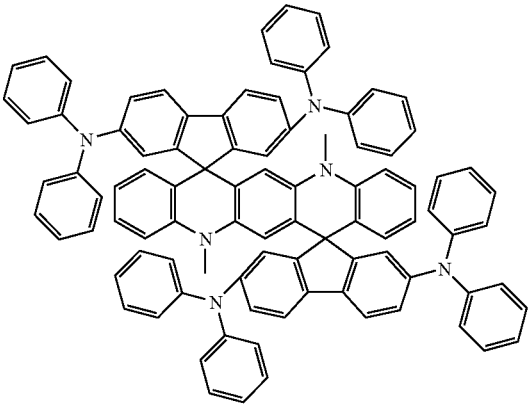
[Formula 1-42]
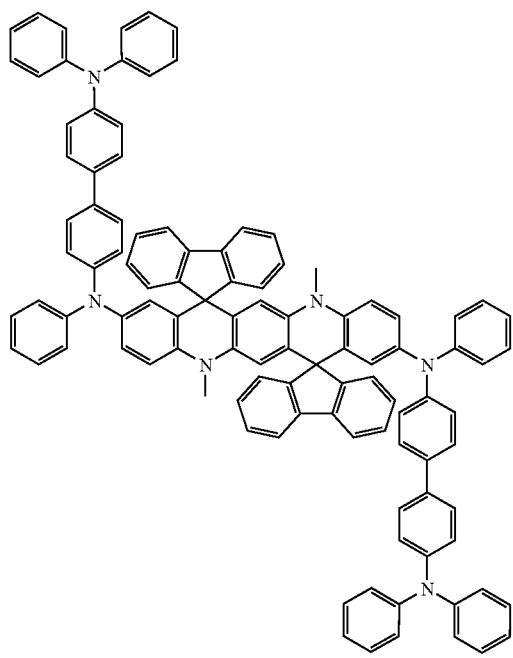
[Formula 1-43]
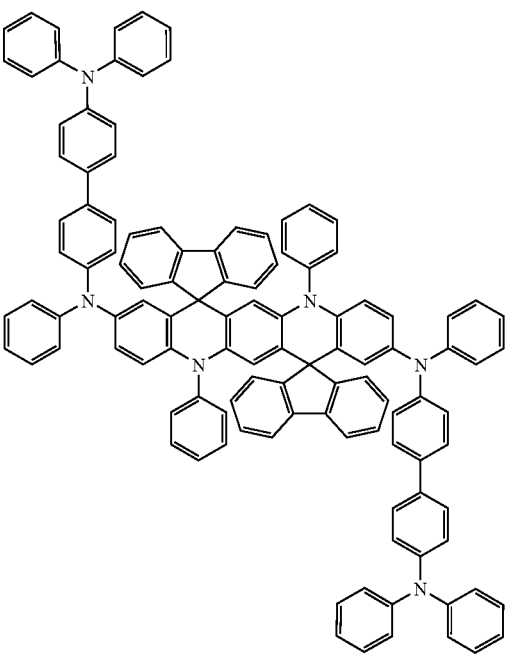
[Formula 1-44]
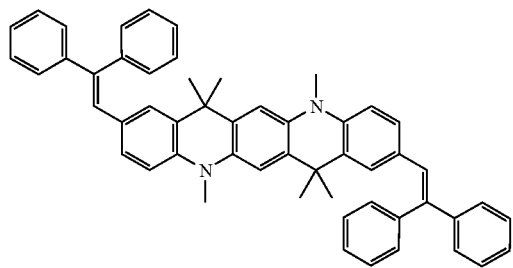
[Formula 1-45]
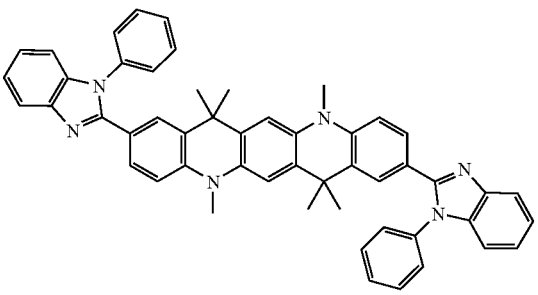

[Formula 1-46]
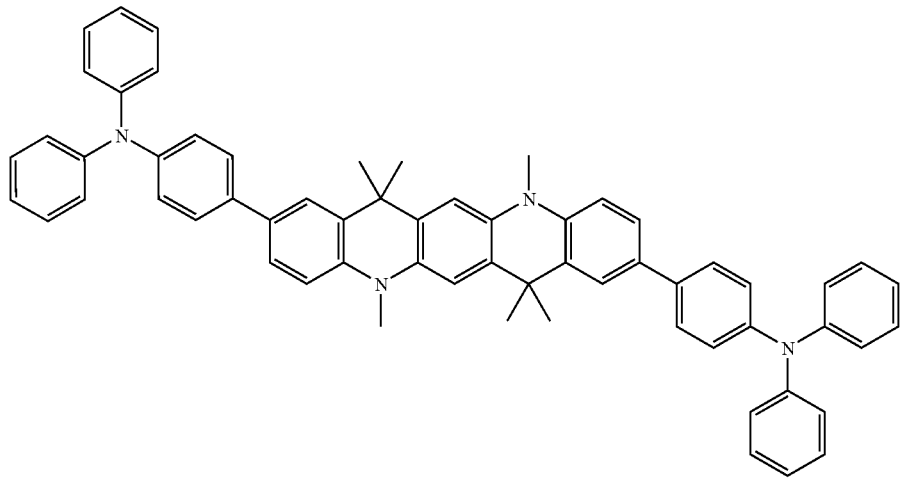
[Formula 1-47]
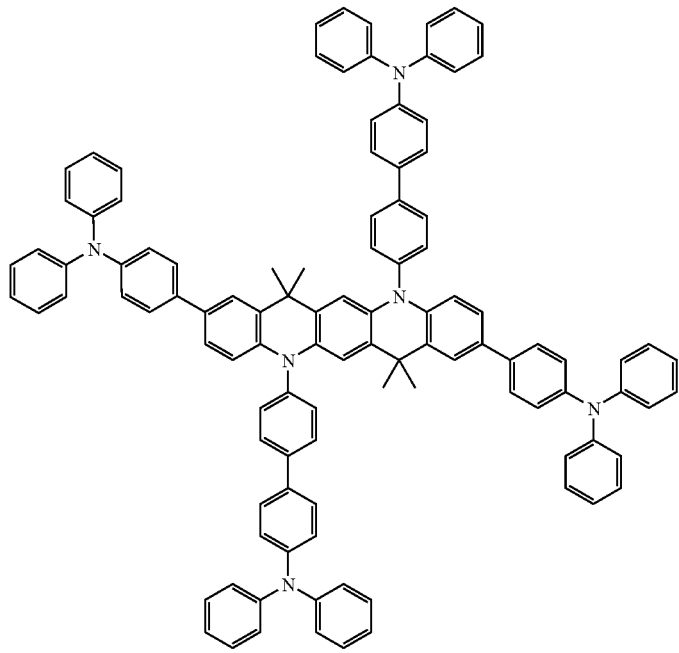
[Formula 1-48]
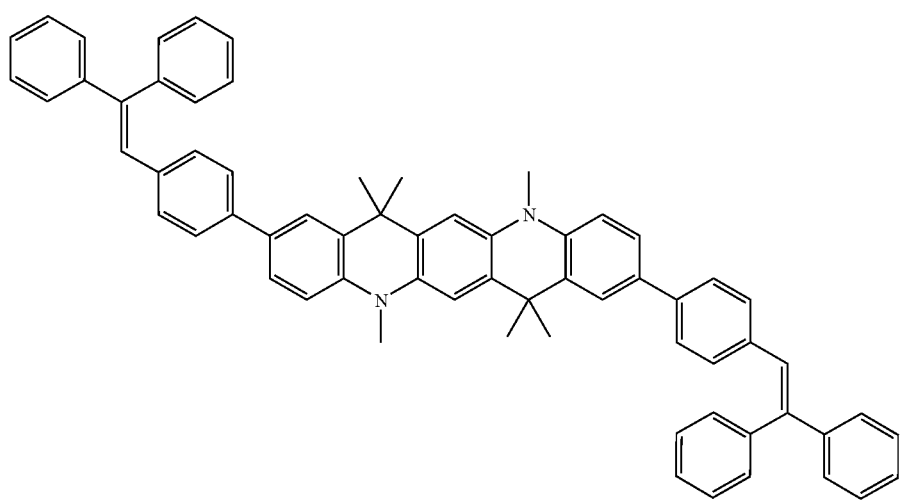

[Formula 1-49]
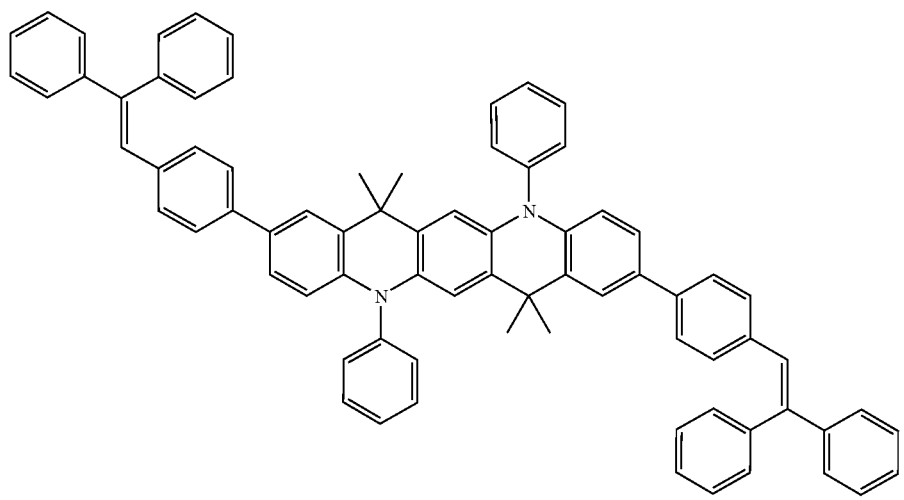
[Formula 1-50]
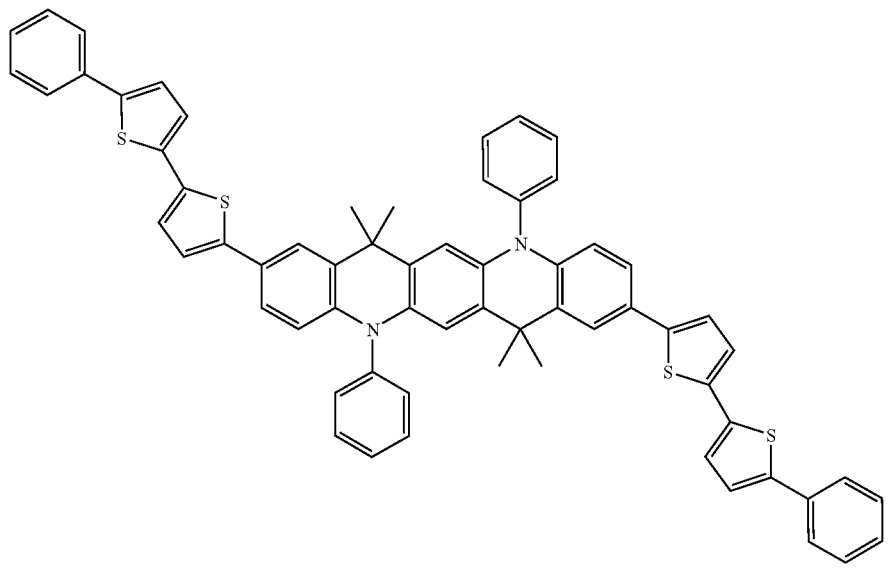
[Formula 1-51]
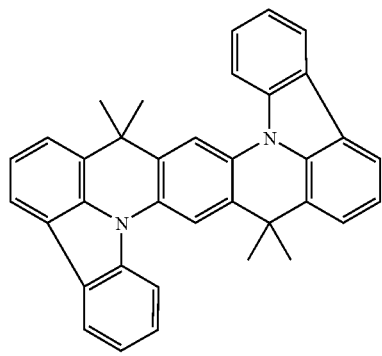
[Formula 1-52]
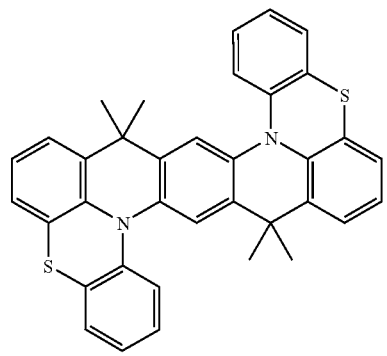

-continued
[Formula 1-53]
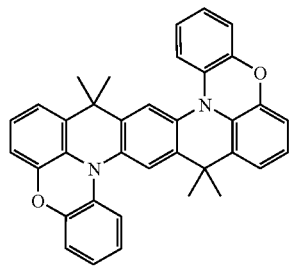
[Formula 1-54]
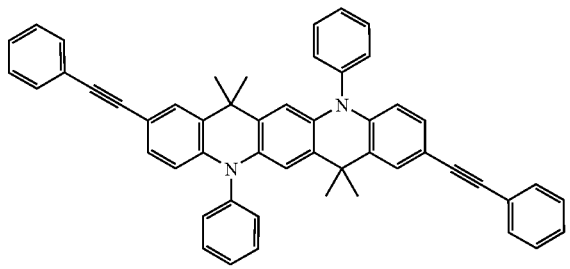
[Formula 1-55]
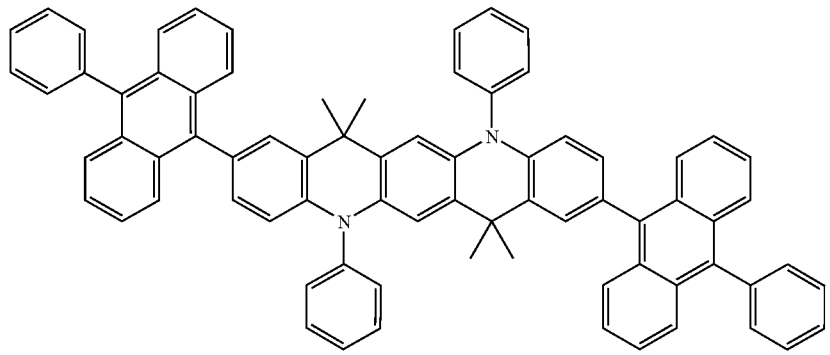
[Formula 1-56]
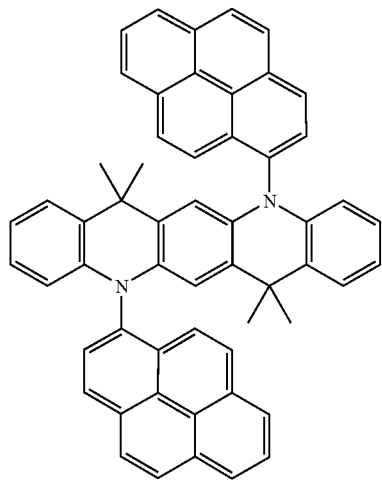
[Formula 1-57]
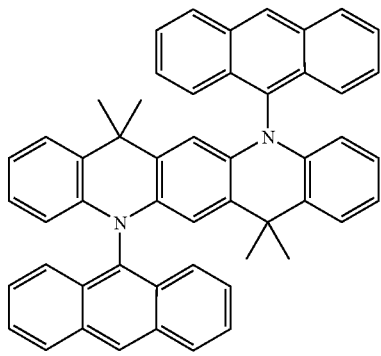
[Formula 1-58]
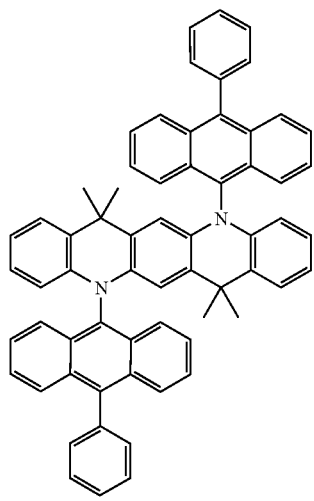
[Formula 1-59]
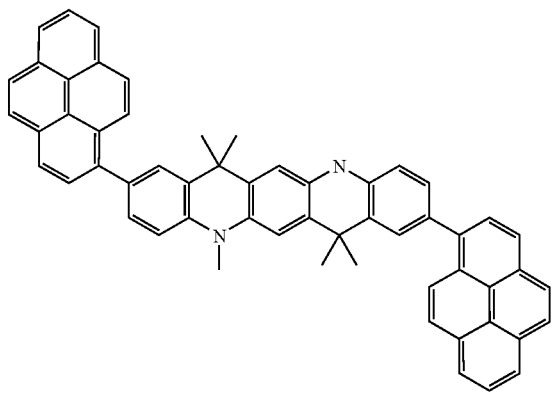

[Formula 1-60]
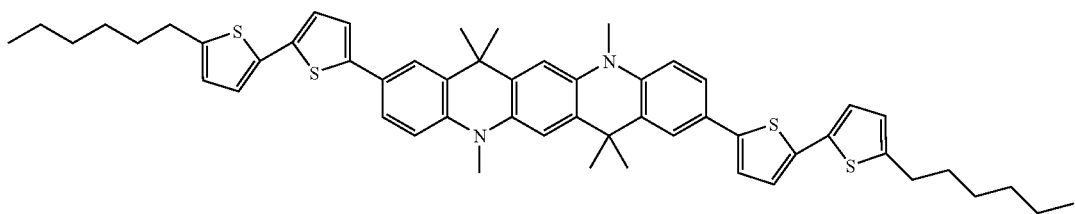
[Formula 1-61]
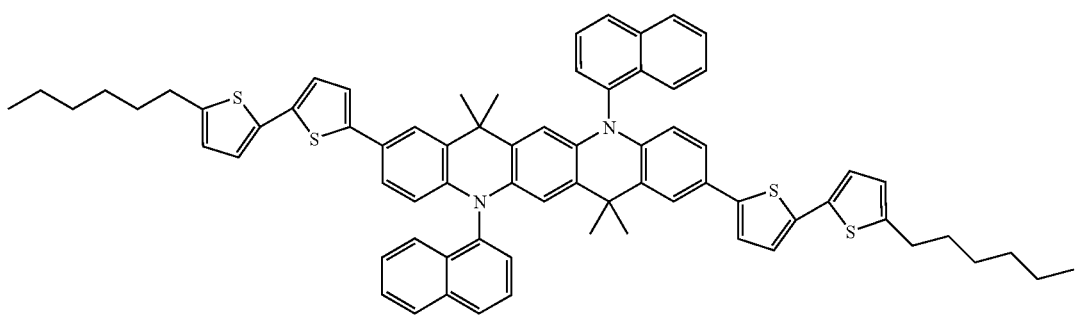
[Formula 1-62]
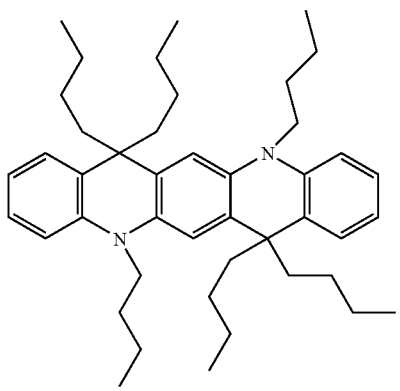
[Formula 1-63]
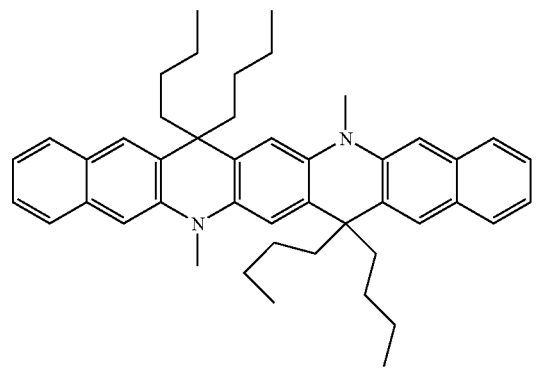
[Formula 1-64]
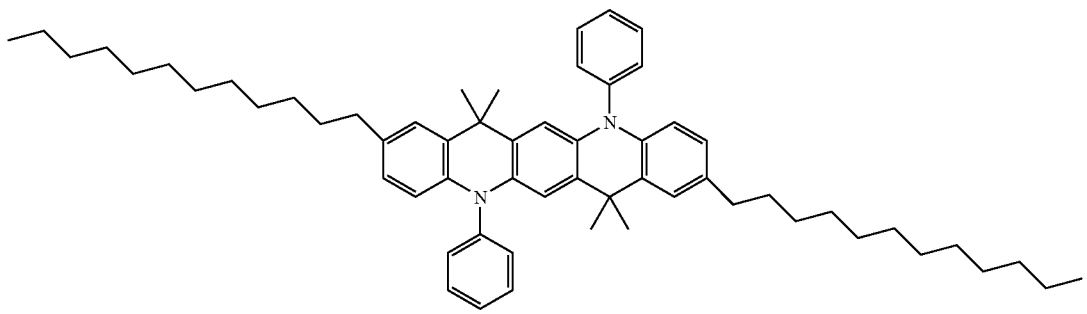

[Formula 1-65]
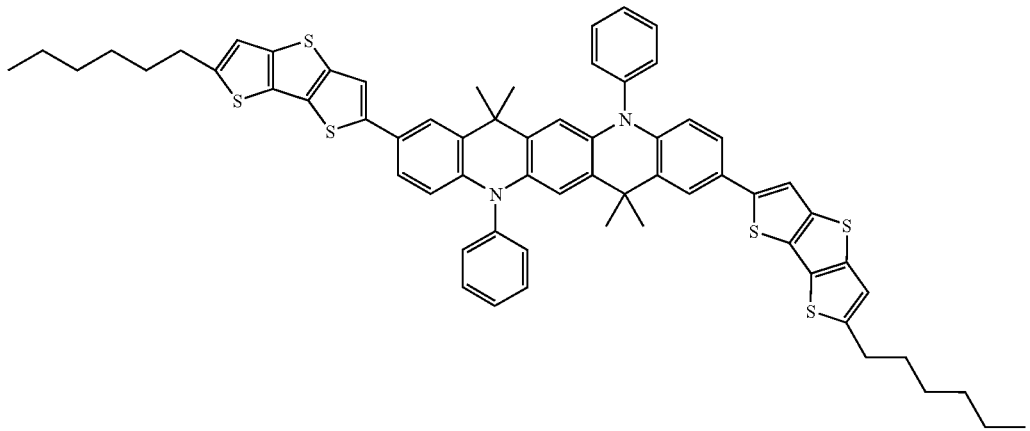
[Formula 1-66]
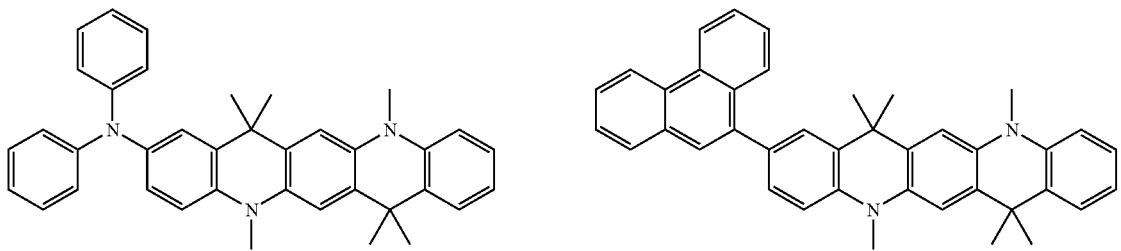
[Formula 1-67]
[Formula 1-68]
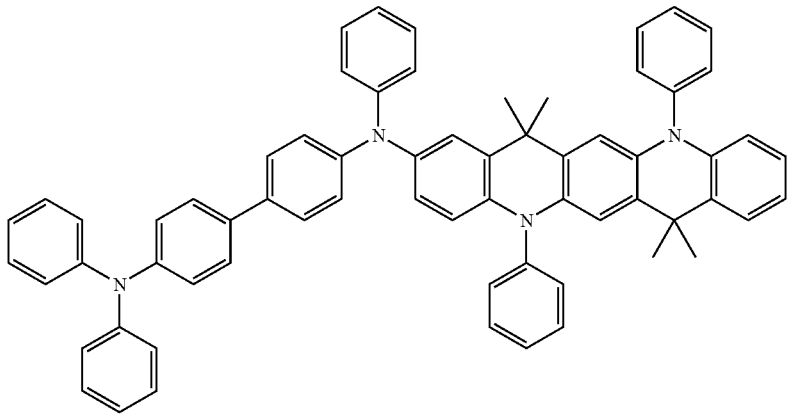
[Formula 1-69]
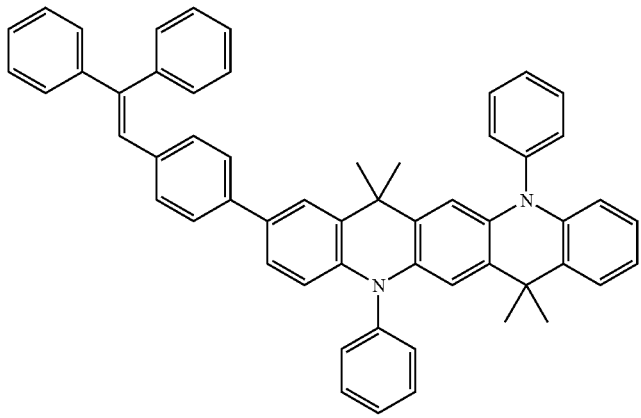

[Formula 1-70]

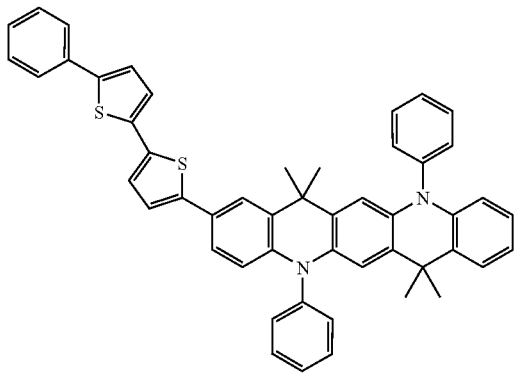

[Formula 1-71]

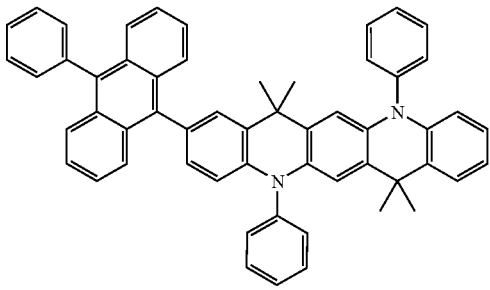

[Formula 1-72]

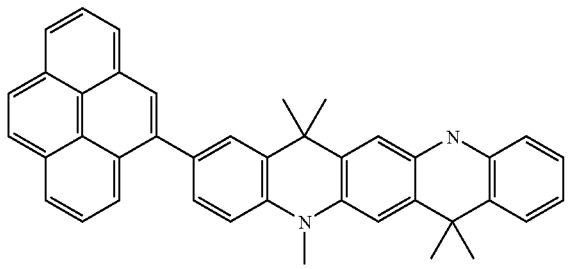

[Formula 1-73]

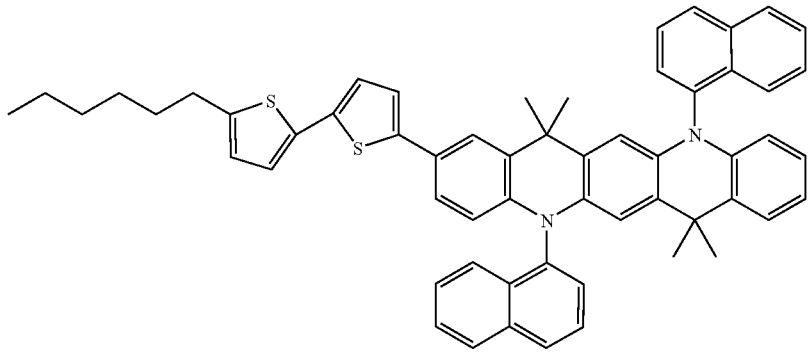

[Formula 1-74]

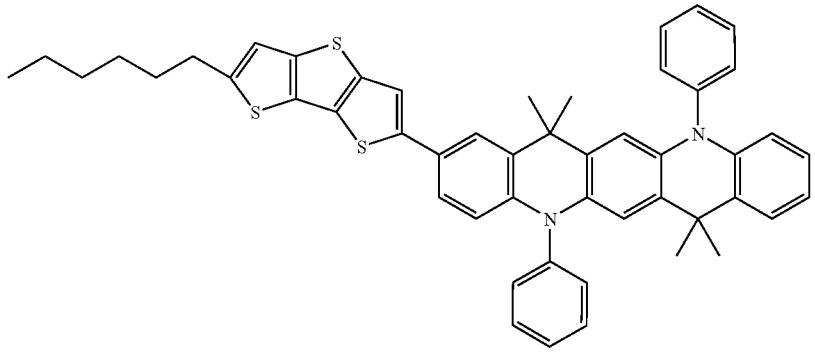

The compound of the formula 1 can have suitable characteristics for use as an organic semiconductor material in an organic electronic device such as an organic light emitting device, an organic transistor, and an organic solar cell by introducing various substituents to the core structure.

More specifically, the core structure of the formula 1 is totally bonded with each other in a cyclic form, thus being present in a substantially one plane. If carbon atoms are bonded to R1 to R4, the carbon atoms get to have a tetrahedron structure as $sp^3$ carbons, thus R1 to R4 being positioned above or below the plane of the core. In such the structure, R1 to R4 can give significant influence on the characteristics of the packing of the molecules. That is, if R1 to R4 are each a hydrogen atom, or a small substituent, the compounds of the formula 1 are molecules in the form of a rigid rod, thus the distance between the molecules being close to each other for better packing. However, if the substituents having a bulky structure in R1 to R4 are introduced, the substituents are protruded above or below the plane of the core, thus the packing of the molecules being harder.

Accordingly, the compound of the formula 1 can have amorphous or crystalline property according to the kind of the substituents. As described above, in the organic light emitting device, it is preferable that the organic thin film remain amorphous for better device characteristics. In the organic transistor, it is preferable that by good packing of the molecules, the organic thin film remains crystalline. Therefore, the compound of the formula 1 is suitable for use in both of the organic light emitting device and the organic transistor, or more suitable for use in either of the organic light emitting device and the organic transistor, according to the kind of the substituents.

On the other hand, quinacridone represented by the following formula 3 is a substance, which contains ketone groups as R1 to R4 of the compound represented by the formula 1 of the present invention.

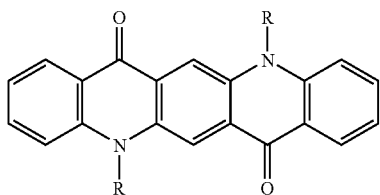

[Formula 3]

In the formula 3, R is a hydrogen atom, an alkyl group or an aryl group.

This substance is widely used as a green light emitting dopant in an organic light emitting device, and one example has been reported, in which it is used as a hole injecting layer. However, as this substance, a substance containing hydrogen as R has been firstly used, and the substance has too low solubility due to a hydrogen bond between hydrogen and a ketone group, to be synthesized and purified, and the hydrogen of the secondary amine present in the molecule is known to remarkably lower the lifetime characteristics of the device. In order to overcome this problem, a derivative having R substituted with an alkyl or aryl group has been developed and used, but the derivative still has low solubility, thus making it hard to synthesize and purify it. Further, since this substance has a strong intermolecular bond, if the substance is used as a dopant, the light emitting wavelength is more likely to be longer as the doping concentration is higher. In addition, these quinacridone derivatives are red solids, and thus have characteristics to absorb light in the visible light region. Accordingly, if these are used as hole injecting layers, there is generated a drawback that it is difficult to prepare a blue or green device because the hole injecting materials absorb a blue or green wavelength emitted from the organic light emitting device. However, the substance represented by the formula 1 of the present invention can solve the problem of absorbing the emitted light wavelength of the device as in quinacridone by the core structure substance having a white solid phase, and by removing the ketone group to weaken the intermolecular bond and increase the solubility. Further, since this core structure has a blue light emitting wavelength, various substituents can be introduce to this core to prepare a substance having various wavelengths and a device using the same.

The compound of the formula 1 can be synthesized from the substances represented by the following formula 4. That is, the compound having R1 to R4 as the substituents in the halogenated form is lithiated, or made into Grignard reagent, and the reagent is added to a solution of the compound represented by the formula 4 to prepare an intermediate such as the compound represented by the formula 5, and the intermediate can be heated under an acidic condition to prepare the compound of the formula 1 as a final product. Here, the compound of the formula 4 is a substance which can be used as an intermediate for synthesis of quinacridone, and a process for preparing the same is widely used.

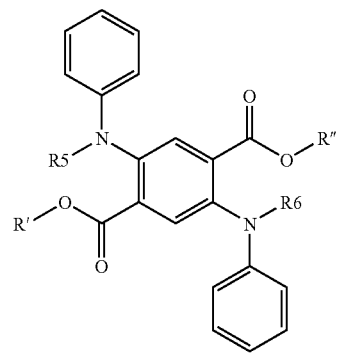

[Formula 4]

wherein R' and R'' are each a methyl group or an ethyl group; and R5 and R6 are each as defined in the formula 1.

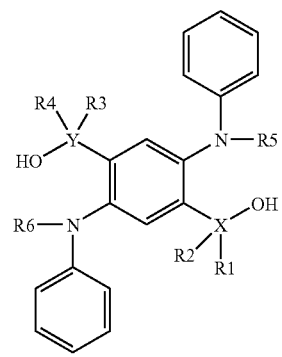

[Formula 5]

wherein X, Y and R1 to R6 are each as defined in the formula 1.

Further, the present invention provides an organic electronic device comprising at least two electrodes, and at least one organic layer disposed between the two electrodes, wherein at least one layer of the organic layers comprises the compound of the formula 1.

The organic electronic device according to the present invention can be prepared using per se known methods or materials in the art, except that at least one layer of the organic layers comprises the compound of the formula 1.

The compound of the formula 1 can be applied to device using a vacuum deposition process or a solution application process. For example, the compound of the formula 1-6 have good sublimation characteristics such that an organic light emitting device can be prepared using a vacuum deposition, and further have good solubility in widely used solvents such as chloroform, THF, and xylene, thereby a solution application process being possibly employed.

In the present invention, the organic electronic device can be an organic light emitting device, an organic transistor, or an organic solar cell.

If the organic electronic device according to the present invention is an organic light emitting device, it can be of a structure, in which a first electrode, at least one organic layer, and a second electrode are sequentially stacked. The organic layer may be of a multilayer structure comprising at least two layers selected from a hole injecting layer, a hole transporting layer, a light emitting layer, and an electron transporting layer, but not limited thereto, and may be of a monolayer structure. The structure of the organic light emitting device according to the invention is illustrated in FIG. 1. For example, the organic light emitting device according to the invention can be produced by depositing metals or metal oxides having electrical conductivity, or metal alloys thereof on a substrate (1) to form anode (2), forming thereon organic material layers comprising a hole injecting layer (3), a hole transporting layer (4), a light emitting layer (5), and an electron transporting layer (6), and then depositing a cathode (7) on the organic material layer, using a PVD (physical vapor deposition) technique such as sputtering and e-beam evaporation. Other than such method, the organic light emitting device can be prepared by depositing a cathode, organic material layers and an anode sequentially on a substrate.

If the organic electronic device according to the present invention is an organic transistor, it can be of a structure as shown in FIG. 2 or 3. That is, the organic transistor according to the present invention can be of a structure comprising an insulating layer (9), a gate electrode (10), a source electrode (11), a drain electrode (12) and an organic layer (13).

If the organic electronic device according to the present invention is an organic solar cell, it can be of a structure as shown in FIG. 4. That is, the organic solar cell according to the present invention can be of a structure, in which anode (15), an electron donor layer (16), an electron acceptor layer (17), and a cathode (18) are sequentially stacked.

MODE FOR INVENTION

Hereinafter, the present invention will be described in more detail by means of Examples. But the following Examples are presented for the purpose of illustrating the present invention, and are not intended to limit the scope of the invention.

Preparative Example 1

Preparation of the Compound of the Formulae 1-6

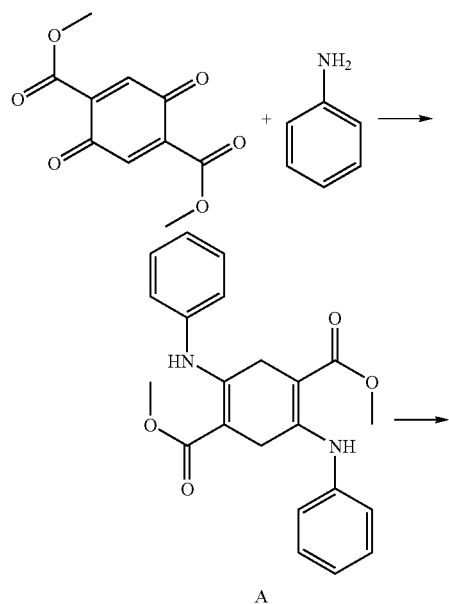

A

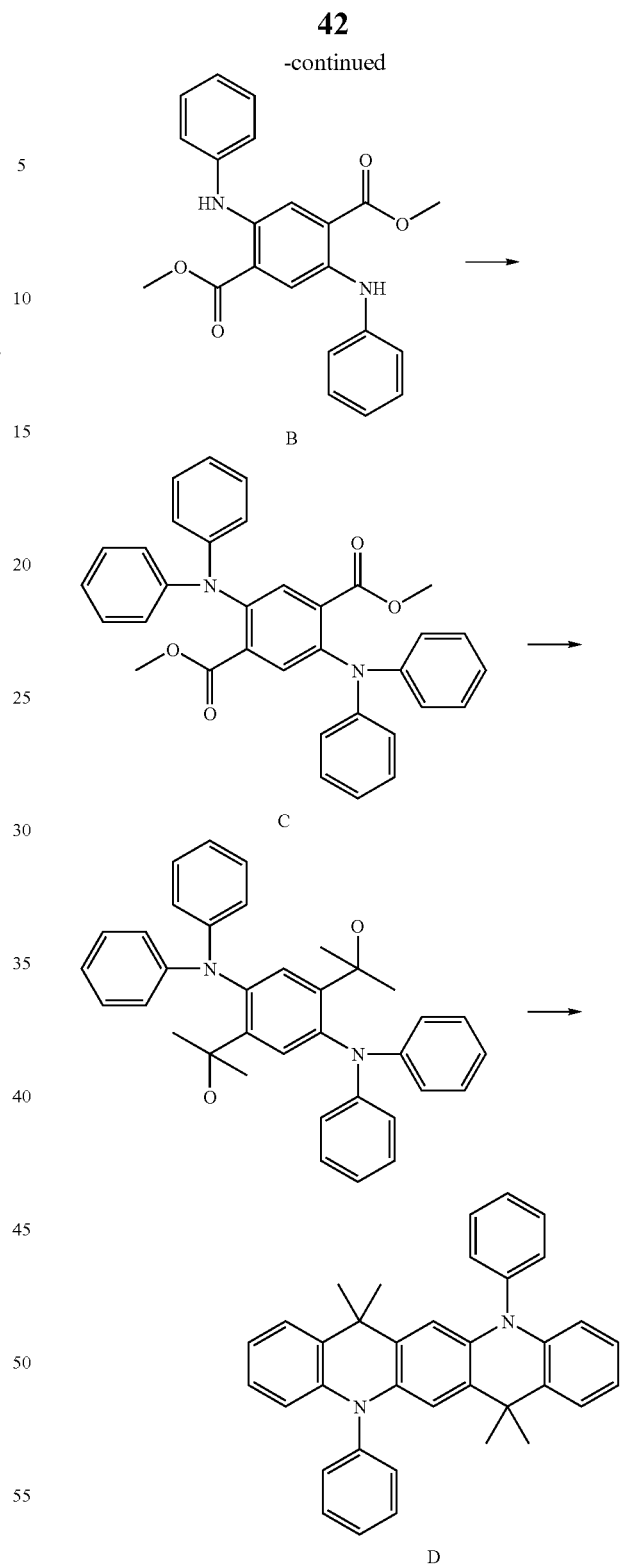

B

C

D

Synthesis of Compound A

Dimethyl-1,4-cyclohexanedione-2,5-dicarboxylate (25 g, 0.1 mol) was added to ethanol (200 ml) and acetic acid (100 ml), to which aniline (27.3 ml, 0.3 mol) was then added. This mixture was refluxed for 2 hours, and then cooled to room temperature. The solid formed was filtered, washed with ethanol, and dried under vacuum to obtain an equivalent amount of the compound A.

NMR (CDCl$_3$): 7.38-7.10 (m, 8H), 3.66 (s, 3H), 3.39 (s, 2H)

Synthesis of the Compound B

The compound A was added to chloroform (1 L), and the mixture was boiled to complete dissolution, and then iodine (25.38 g, 0.1 mol) and ethanol (400 ml) were added thereto. The mixture was refluxed for 6 hours. Then, the solvent was distilled off under reduced pressure, and ethanol (500 ml) was added to the residue. The mixture was stirred. The solid formed was filtered, washed with ethanol, and dried under vacuum to obtain the compound B 29.5 g (78.5% yield).

NMR (DMSO-d$_6$): 8.54 (s, 2H), 7.80 (s, 2H), 7.33-7.29 (t, 4H), 7.14-7.12 (d, 4H), 6.99-6.95 (t, 2H), 3.79 (s, 6H)

Synthesis of the Compound C

The compound B (3.76 g, 10 mmol), iodobenzene (6.71 ml, 60 mmol), K$_2$CO$_3$ (2.764 g, 20 mmol), copper (1.271 g, 20 mmol), and copper iodide (0.190 g, 1.0 mmol) were added into a flask, and the mixture was stirred at 150 to 160° C. overnight. This reaction product was cooled to room temperature, chloroform was added thereto, and the mixture was stirred. This reaction product was filtered to remove solids, and the solvent was removed from the filtrate. To the resulting solid, ethanol was added, and the mixture was stirred for 1 hour, filtered, and dried under vacuum to obtain the compound C (4.49 g, 85% yield).

MS: [M+H]$^+$=529

Synthesis of the Compound D (the Compound of the Formula 1-6)

The compound C (2.643 g, 5 mmol) was dissolved in dried THF, and then methyl lithium (1.6 M in hexane) (18.8 ml, 30 mmol) was slowly added thereto at 0° C. This reaction mixture was warm to room temperature, and further stirred for 2 hours. Water was added to the resulting mixture to terminate the reaction. The resulting yellow solid was filtered, washed with ethyl ether, and dried under vacuum at 50° C. to obtain 1.947 g of a yellow solid. This yellow solid was dispersed in acetic acid (20 ml), and 20 drops of concentrated hydrochloric acid was added thereto. The mixture was stirred for 2 hours at 120° C. Then, the mixture was cooled to room temperature, and the solid was filtered off. The resulting material was washed with ethanol and water, and dried under vacuum to obtain the compound D (the compound of the formula 1-6).

MS: [M+H]$^+$=493

Tm: 346.06° C.

Preparative Example 2

Synthesis of the Compound of the Formula 1-62

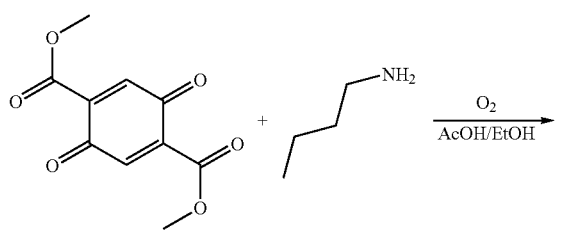

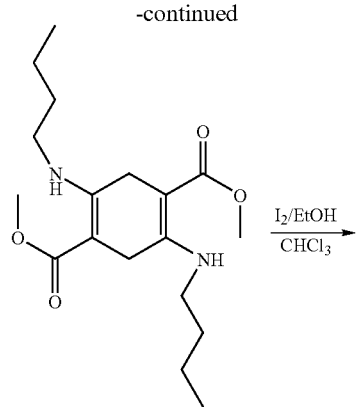

E

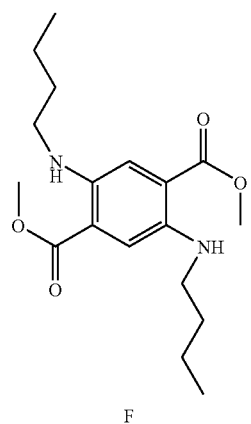

F

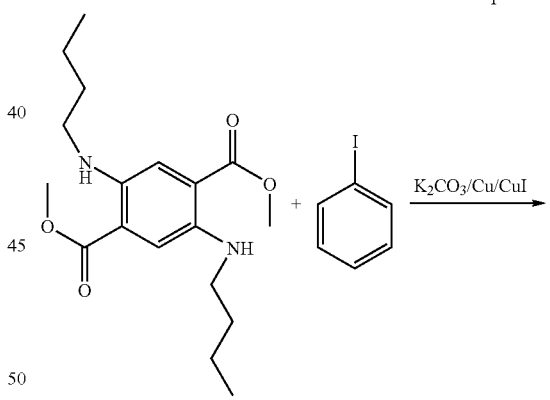

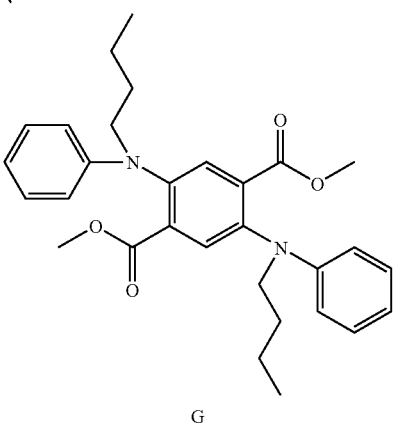

G

-continued

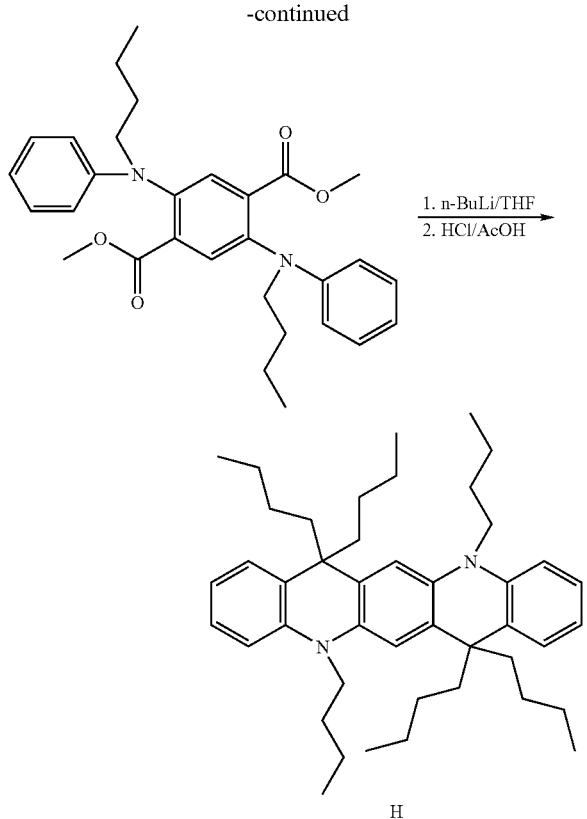

H

Synthesis of the Compound E

Dimethyl-1,4-cyclohexanedione-2,5-dicarboxylate (10.117 g, 40 mmol) was dispersed in ethanol (100 ml), to which n-butyl amine (7.91 ml, 80 mmol) was added. The mixture was stirred for 10 minutes under oxygen atmosphere. To the mixture, acetic acid (50 ml) was added, and the mixture was refluxed for 3 days. Then, the mixture was cooled to room temperature, filtered, and washed with ethanol. This reaction product was dried under vacuum to obtain the compound E (11.46 g, 84.65% yield).

Synthesis of the Compound F

The compound E (11.46 g, 40 mmol) was dissolved in chloroform (200 ml), and then iodine (10.15 g, 40 mmol) and ethanol (100 ml) were added thereto. The mixture was refluxed for 5 hours. Then, the mixture was cooled to room temperature, water was then added thereto, and the mixture was extracted by using methylene chloride. Water and the solvent were sequentially removed therefrom, and ethanol was added to the resulting solid for dispersion. The mixture was stirred overnight. The reaction product was filtered, washed with ethanol, and dried in vacuum to obtain the compound F (2.6 g, 19.3% yield).

Synthesis of the Compound G

The compound F (2.6 g, 7.73 mmol), iodobenzene (10 ml), $K_2CO_3$ (2.14 g, 15.46 mmol; 2 equivalents), copper (0.982 g, 15.46 mmol; 2 equivalents), and copper iodide (0.15 g, 0.773 mmol; 10 mol %) were added into a flask, and the mixture was refluxed under nitrogen atmosphere for 4 days. This reaction mixture was cooled to room temperature, filtered, washed with THF, and combined with the previously obtained filtrate, and then the solvent was removed therefrom. The resulting product was separated by column chromatography, and the obtained product was then dispersed in ethanol. The mixture was stirred for 1 hour, filtered, and dried under vacuum to obtain 2.31 g (61.2% yield) of an orange colored product, the compound G.

Synthesis of the Compound H (the Compound of the Formula 1-62)

Under nitrogen atmosphere, the compound G (1.955 g, 4.0 mmol) was added to purified THF (20 ml), and n-BuLi (2.5 M in hexane) (8 ml, 20 mmol) was slowly added thereto at 0° C. Then, the mixture was stirred at the same temperature for 30 minutes, warmed to room temperature, and further stirred for 2 hours. Water was added to the mixture to terminate the reaction, and extracted by using ethyl acetate. The solvent was removed from the reaction mixture, and acetic acid (20 ml) and 20 drops of concentrated hydrochloric acid were added to the obtained residue. The mixture was refluxed for 4 hours. The reaction product was cooled to room temperature, and then the solvent was removed therefrom. Ethyl acetate was added to the residue, and the mixture was passed through silica gel. The residual liquid after removing the solvent from the materials which had passed through the silica gel was dispersed in ethanol, and refluxed. The reaction product was filtered, and dried under vacuum to obtain 0.11 g (4.4% yield) of the compound H (the compound of the formula 1-62).

MS: $[M+H]^+$=622

Preparation of an Organic Light Emitting Device

Experimental Example 1

A glass substrate (Corning 7059 glass) on which a thin film of ITO (indium tin oxide) was coated to a thickness of 1000 Å was immersed in distilled water containing a detergent to wash the substrate with ultrasonic waves. At this time, the detergent was a product commercially available from Fisher Co. and the distilled water has been filtered twice by using a filter commercially available from Millipore Co. ITO was washed for 30 minutes, and then washing with ultrasonic waves was repeated twice for 10 minutes by using distilled water. After the completion of washing with distilled water, washing with ultrasonic waves was carried out by using solvents such as isopropyl alcohol, acetone and methanol. The resultant product was dried, and then transported to a plasma cleaning device. The substrate was dry washed for 5 minutes at 85 W under a pressure of 14 mtorr using nitrogen plasma. Then, the substrate was transported to a vacuum depositing chamber.

On the ITO electrode thus prepared, hexanitrile hexaazatriphenylene (hereinafter, referred to as HAT) as an n-type organic material of the following formula was coated to thicknesses of 80 Å, to form anode comprising an ITO conducting layer and an n-type organic material.

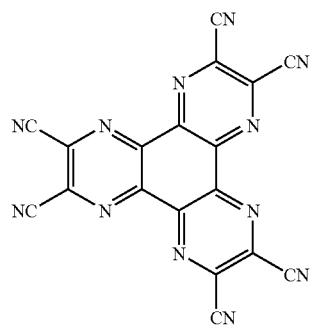

[HAT]

On the anode, the compound of the formula 1-6 (800 Å) was vacuum-deposited to form a hole injecting layer. On the hole injecting layer, NPB represented by the following formula was deposited to a thickness of 300 Å, thus to form a hole transporting layer. On the hole transporting layer, Alq3 was vacuum-deposited to a thickness of 300 Å, thus to form a light emitting layer. On the light emitting layer, the electron transporting layer material of the following formula was deposited to a thickness of 200 Å, thus to form an electron transporting layer.

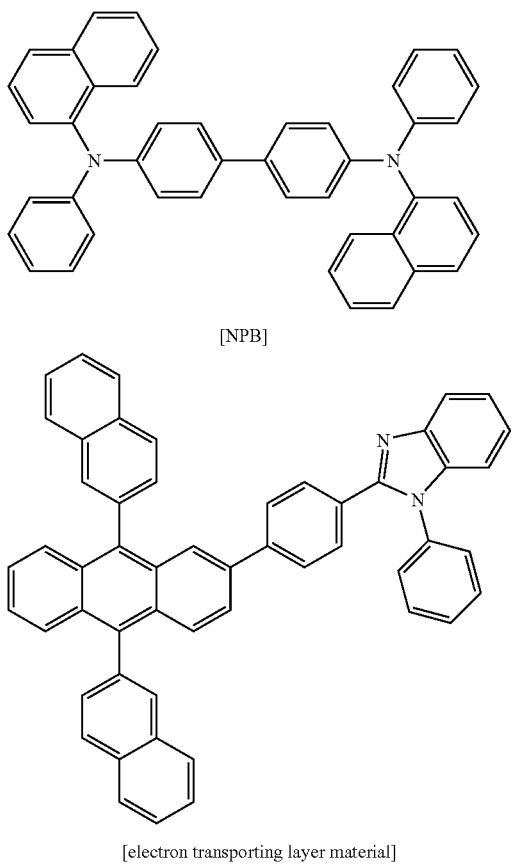

[NPB]

[electron transporting layer material]

On the electron transporting layer, lithium fluoride (LiF) and aluminum were sequentially deposited to a thickness of 12 Å and 2000 Å, respectively, to form a cathode.

In the above process, the deposition rate of the organic material was maintained at 0.3 to 0.8 Å/sec and the deposition rates of lithium fluoride and aluminum of the cathode were maintained at 0.3 Å/sec and 1.5 to 2.5 Å/sec, respectively. The vacuum degree during deposition was maintained at 1 to $3\times10^{-7}$ torr.

In the device prepared above, an electric field of 4.49 V was observed at a forward current density of 100 mA/cm², and green light emission was observed with a power efficiency of 1.79 lm/W. Light emitting by the device at the above drive voltage indicates that the compound the formula 1-6 functions to inject holes.

Experimental Example 2

An n-doped silicon wafer was used as a substrate and a gate electrode, and silicon oxide (300 nm) as grown and prepared by heat treatment thereon was used as a gate insulating film. Over the gate insulating film, an e-beam was used to form a source electrode and a drain electrode, made of gold. The substrate prepared above was treated with HMDS (hexamethyldisilazane). Over the substrate, on which the source electrode and the drain electrode had been formed, the compound 1-6 (500 Å) was vacuum-deposited to form an organic semiconductor layer. At this time, the deposition rate of the organic semiconductor material was maintained at 0.3 Å/sec with a vacuum degree of $1\times10^{-6}$ torr. At this time, the width and the length of the channel of the organic transistor were 1 mm and 100 µm, respectively.

The graph showing the characteristics of the transistor prepared above is illustrated in FIG. 6. At this time, the carrier mobility in the saturated region was calculated to be $7\times10^{-6}$ cm²/V·s.

FIG. 5 illustrates the results of the surface analysis of the vacuum-deposited compound of the formula 1-6 using AFM (Atomic Force Microscope).

As shown in FIG. 5, the compound of the formula 1-6 was well crystallized.

The invention claimed is:

1. A compound of the following formula 1:

[Formula 1]

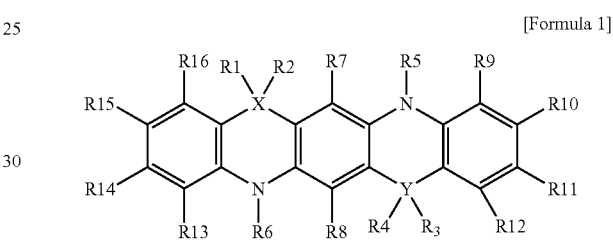

wherein X and Y are each respectively or simultaneously C or Si;

R1 to R4 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a halogen group, a substituted or unsubstituted amide group, a substituted or unsubstituted imide group and a substituted or unsubstituted ester group wherein they may form an aliphatic, aromatic or hetero aromatic fused ring or a Spiro bond, together with the adjacent group; and R5 to R16 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a sulfonyl group, a halogen group, a substituted or unsubstituted amide group, a substituted or unsubstituted imide group, a substituted or unsubstituted ester group, wherein R5 and R6 may be directly linked with the adjacent group, respectively and R5 to R16 may form an aliphatic, aromatic or hetero aromatic fused ring, together with the adjacent group.

2. The compound according to claim 1, wherein the compound of the formula 1 is the compound of the following formula 2:

[Formula 2]

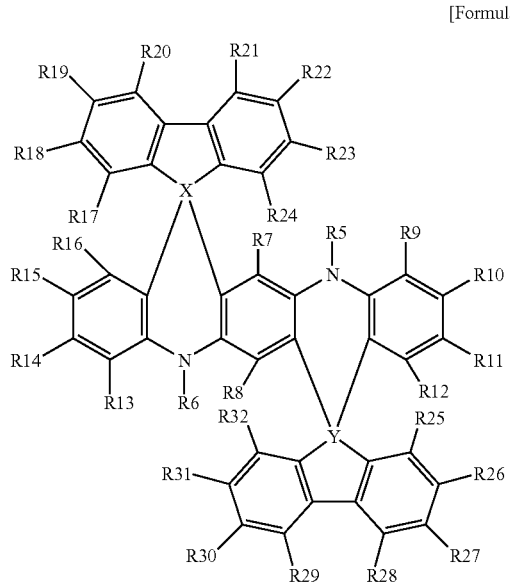

wherein X, Y and R5 to R16 are as defined in the formula 1; and

R17 to R32 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a sulfonyl group, a halogen group, a substituted or unsubstituted amide group, a substituted or unsubstituted imide group and a substituted or unsubstituted ester group wherein they may form an aliphatic, aromatic or hetero aromatic fused ring, together with the adjacent group.

3. An organic electronic-device-comprising at least two electrodes, and at least one organic layer disposed between the two electrodes, wherein at least one layer of the organic layers comprises the compound of the formula 1 according to claim 1.

4. The organic electronic device according to claim 3, wherein the organic electronic device is an organic light emitting device having a structure, in which a first electrode, at least one organic layer, and a second electrode are sequentially stacked, and at least one layer of the organic layers comprises the compound of the formula 1.

5. The organic electronic device according to claim 3, wherein the organic electronic device is an organic transistor having a structure comprising a gate electrode, an insulating layer, at least one organic layer, a source electrode and a drain electrode, and at least one layer of the organic layers comprises the compound of the formula 1.

6. The organic electronic device according to claim 3, wherein the organic electronic device is an organic solar cell having a structure, in which an anode, an electron donating layer, an electron accepting layer, and a cathode are sequentially stacked, and at least one layer of the electron donating layer and the electron accepting layer comprises the compound of the formula 1.

7. The organic electronic device according to claim 3, wherein the compound of the formula 1 is the compound of the following formula 2:

[Formula 2]

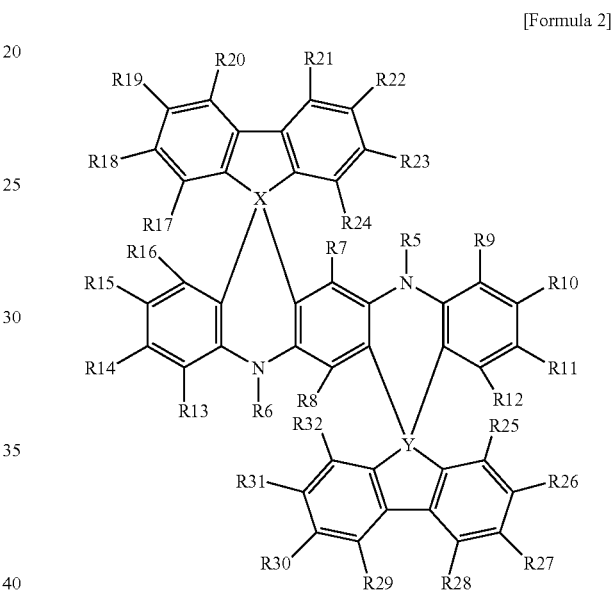

wherein X, Y and R5 to R16 are as defined in the formula 1; and

R17 to R32 are each respectively or simultaneously selected from the group consisting of a hydrogen atom, a substituted or unsubstituted straight or branched alkyl group, a substituted or unsubstituted straight or branched alkoxy group, a substituted or unsubstituted straight or branched thioalkoxy group, a substituted or unsubstituted straight or branched alkenyl group, a substituted or unsubstituted straight or branched alkynyl group, a substituted or unsubstituted aryl group, a substituted or unsubstituted arylamine group, a substituted or unsubstituted heterocyclic group, a substituted or unsubstituted amino group, a nitrile group, a nitro group, a sulfonyl group, a halogen group, a substituted or unsubstituted amide group, a substituted or unsubstituted imide group and a substituted or unsubstituted ester group wherein they may form an aliphatic, aromatic or hetero aromatic fused ring, together with the adjacent group.

* * * * *